(12) United States Patent
Lee et al.

(10) Patent No.: US 12,444,351 B2
(45) Date of Patent: Oct. 14, 2025

(54) LIGHT PATH CONTROL MEMBER WHICH SWITCH BETWEEN A SHARE MODE AND A PRIVACY MODE, AND DISPLAY DEVICE INCLUDING SAME

(71) Applicant: LG Display Co., Ltd., Seoul (KR)

(72) Inventors: Sanghyun Lee, Paju-si (KR); Hyukjoon Yoon, Paju-si (KR); Yongseok Lee, Paju-si (KR); Minsoo Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/497,507

(22) Filed: Oct. 30, 2023

(65) Prior Publication Data
US 2024/0177658 A1    May 30, 2024

(30) Foreign Application Priority Data
Nov. 24, 2022   (KR) .......................... 10-2022-0159118

(51) Int. Cl.
| | | |
|---|---|---|
| *G09G 3/3225* | (2016.01) | |
| *G02F 1/29* | (2006.01) | |
| *G09G 3/36* | (2006.01) | |

(52) U.S. Cl.
CPC ............. *G09G 3/3225* (2013.01); *G02F 1/29* (2013.01); *G09G 3/36* (2013.01); *G09G 2300/0408* (2013.01); *G09G 2300/0426* (2013.01); *G09G 2320/028* (2013.01); *G09G 2320/0626* (2013.01)

(58) Field of Classification Search
CPC ....................................................... G02F 1/29
See application file for complete search history.

(56) References Cited

U.S. PATENT DOCUMENTS

| | | | |
|---|---|---|---|
| 2020/0124834 A1* | 4/2020 | Woodgate | ............ G09G 3/3406 |
| 2020/0228764 A1* | 7/2020 | Chen | ...................... G02F 1/133 |

FOREIGN PATENT DOCUMENTS

| | | | | |
|---|---|---|---|---|
| KR | 20170085816 A | | 7/2017 | |
| KR | 102039973 B1 | * | 11/2019 | ............ A45D 34/06 |
| KR | 20210013854 A | | 2/2021 | |
| KR | 20210043194 A | | 4/2021 | |

OTHER PUBLICATIONS

KR102039973B1 machine translation (Year: 2024).*

* cited by examiner

*Primary Examiner* — Gustavo Polo
(74) *Attorney, Agent, or Firm* — Seed Intellectual Property Law Group LLP

(57) ABSTRACT

A light path control member according to an embodiment includes a first substrate; a first electrode disposed on the first substrate; a first light conversion unit disposed on the first electrode; a second substrate disposed on the first light conversion unit; a second electrode including a sub-electrode that is disposed between the second substrate and the first light conversion unit and extends along a first direction, and a second sub-electrode that extends along a second direction crossing the first direction; and a third electrode disposed on an upper surface of the second substrate.

28 Claims, 25 Drawing Sheets

LIGHT PATH CONTROL MEMBER WHICH SWITCH BETWEEN A SHARE MODE AND A PRIVACY MODE, AND DISPLAY DEVICE INCLUDING SAME

CROSS-REFERENCE TO RELATED APPLICATION

The present application claims priority to Korean Patent Application No. 10-2022-0159118, filed Nov. 24, 2022, the entire contents of which is incorporated herein for all purposes by this reference.

BACKGROUND

Technical Field

The disclosure relates to a light path control member and a display device including the same.

Description of the Related Art

A light-shielding film shields transmitting of light from a light source, and is attached to a front surface of a display panel which is a display device used for a mobile phone, a notebook, a tablet PC, a vehicle navigation device, a vehicle touch, etc., so that the light-shielding film adjusts a viewing angle of light according to an incident angle of light to express a clear image quality at a viewing angle needed by a user when the display transmits a screen.

In addition, the light-shielding film may be used for the window of a vehicle, building or the like to shield outside light partially to prevent glare, or to prevent the inside from being visible from the outside.

That is, the light-shielding film may be a light path conversion member that controls the travel path of light, blocks light in a specific direction, and transmits light in a specific direction. Accordingly, the transmission angle of light is controlled by the light-shielding film, so the user's viewing angle can be controlled.

BRIEF SUMMARY

An object to be achieved by the disclosure is to provide a light path control member capable of switching between a first mode (share mode) and a second mode (privacy mode).

Another object to be achieved by the disclosure is to provide a display device including a light path control member capable of switching between a first mode (share mode) and a second mode (privacy mode).

The objects of the disclosure is not limited to the above-mentioned object, and other technical objects not mentioned can be clearly understood by those skilled in the art from the description below.

In order to achieve the above object, a light path control member according to an embodiment includes a first substrate; a first electrode disposed on the first substrate; a first light conversion unit disposed on the first electrode; a second substrate disposed on the first light conversion unit; a second electrode including a sub-electrode, namely, the first sub-electrode, that is disposed between the second substrate and the first light conversion unit and extends along a first direction, and a second sub-electrode that extends along a second direction crossing the first direction; and a third electrode disposed on an upper surface of the second substrate.

In order to achieve the above object, a display device according to an embodiment includes a display panel; and a light path control member on the display panel, wherein the light path control member comprises a first substrate, a first electrode disposed on the first substrate, a first light conversion unit disposed on the first electrode, a second substrate disposed on the first light conversion unit, a second electrode including a sub-electrode that is disposed between the second substrate and the first light conversion unit and extends along a first direction, and a second sub-electrode that extends along a second direction crossing the first direction, and a third electrode disposed on an upper surface of the second substrate.

Other details of embodiments are included in detailed descriptions and drawings.

According to the light path control member and the display device according to the embodiments, it is possible to switch between the first mode (share mode) and the second mode (privacy mode) in a plurality of directions.

Furthermore, a front transmittance may be increased by using a difference in refractive index between the light transmission part and the light path variable part of the light conversion unit.

The effects of the embodiments are not restricted to the one set forth herein, and more various effects are included in the specification.

DETAILED DESCRIPTION

Figure 1:
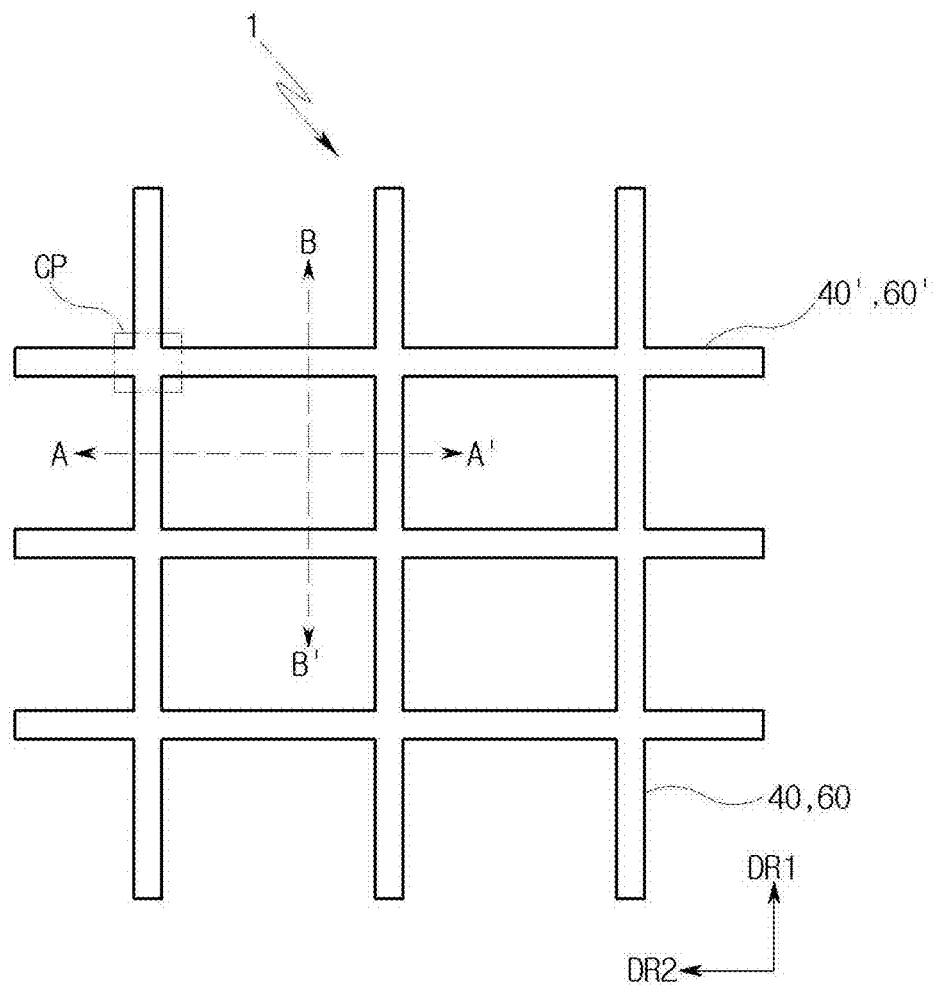
FIG. 1 is a plan view of a second electrode and a third electrode according to an embodiment.

The advantages and features of the disclosure and ways to achieve them will be apparent by making reference to embodiments as described below in detail in conjunction with the accompanying drawings. However, the disclosure is not limited to the embodiments set forth below, but may be implemented in various different forms. The following embodiments are provided as examples to completely disclose the disclosure and inform those skilled in the art of the scope of the disclosure, and the disclosure is sufficiently broad to include the scope of the appended claims.

When elements or layers are referred to as "on" of another element or layer includes all cases where another layer or other element is interposed directly on or in the middle of another element. The same reference numerals refer to the same components throughout the specification. The shapes, sizes, ratios, angles, numbers, etc., disclosed in the drawings for describing the embodiments are examples, and the disclosure is not limited to the illustrated matters.

Although the first, second, and the like are used to describe various components, it goes without saying that these elements are not limited by these terms. These terms are only used to distinguish one component from another component. Therefore, it goes without saying that the first component mentioned below may be the second component within the technical idea of the disclosure.

Each of the features of the various embodiments of the disclosure can be partially or entirely combined or combined with each other, technically various interlocking and driving are possible, and each of the embodiments can be implemented independently of each other or can be implemented together in a related relationship.

Hereinafter, specific embodiments will be described with reference to the accompanying drawings.

Figure 2:
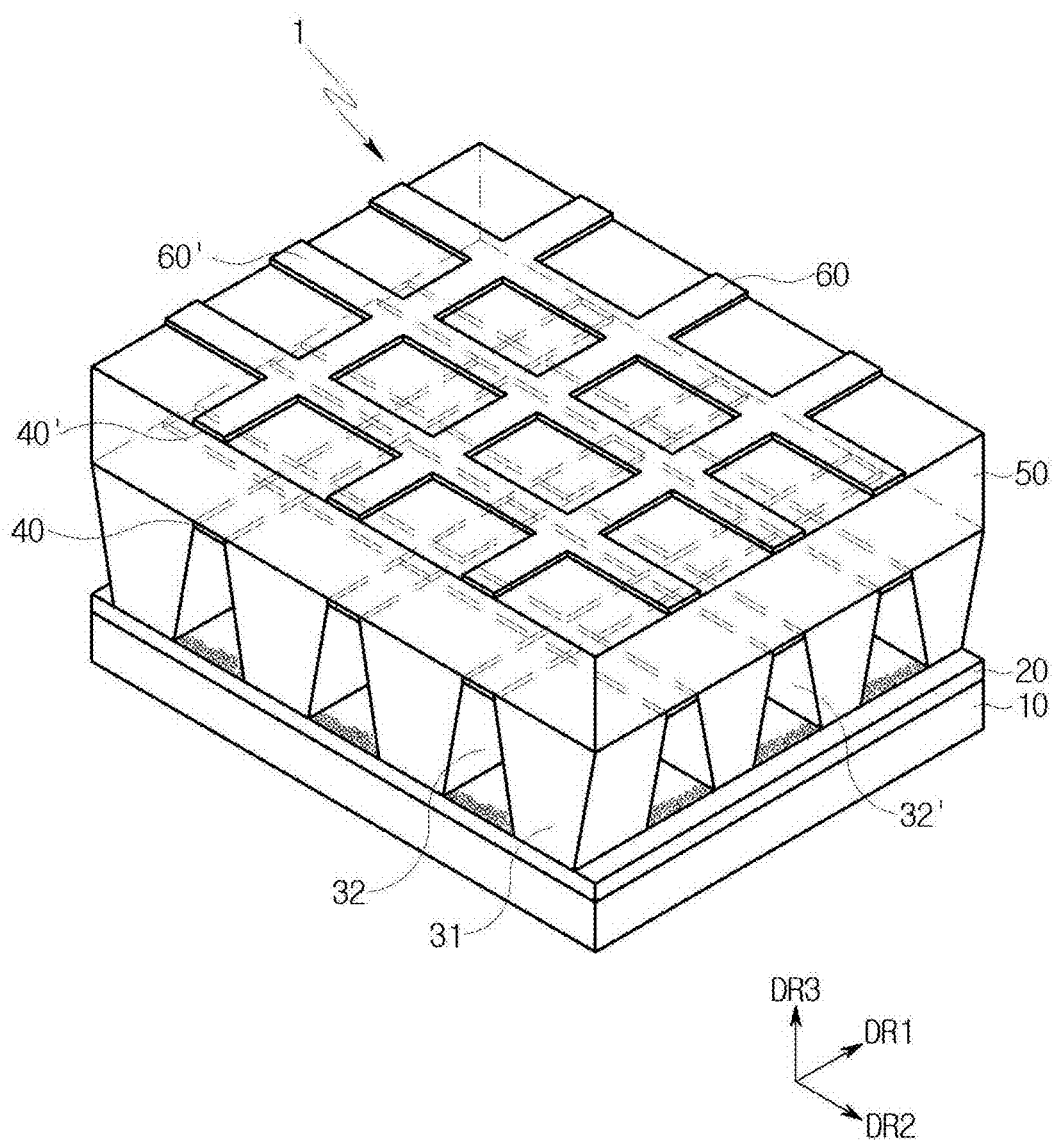
FIG. 2 is a perspective view of a light path control member according to an embodiment.
Figure 3:
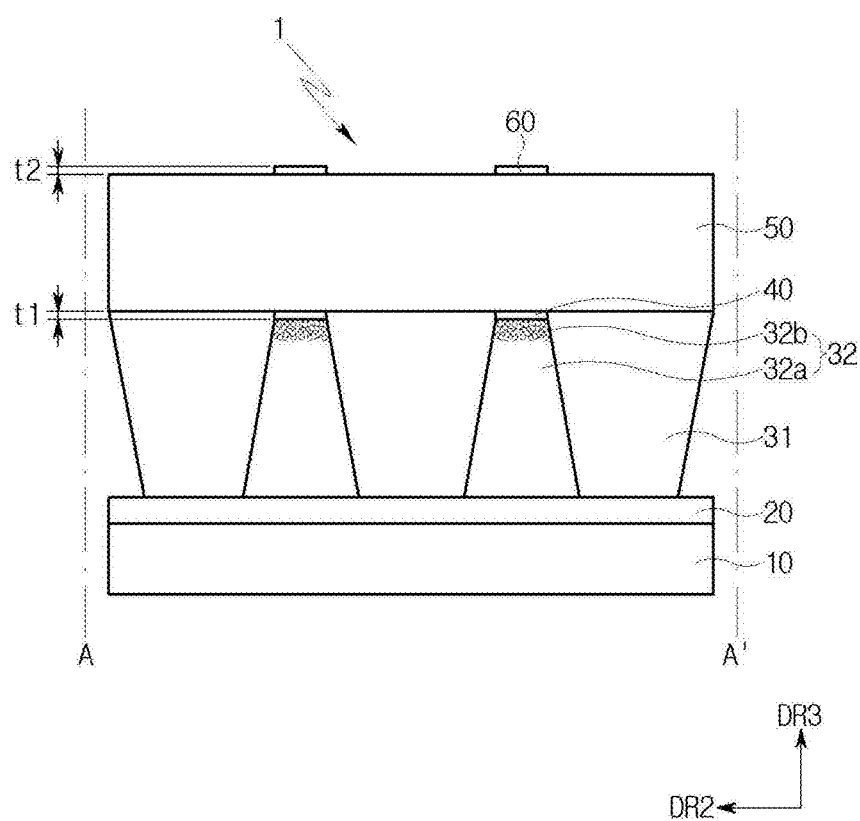
FIG. 3 is a cross-sectional view taken along the line A-A' in FIG. 1.
Figure 4:
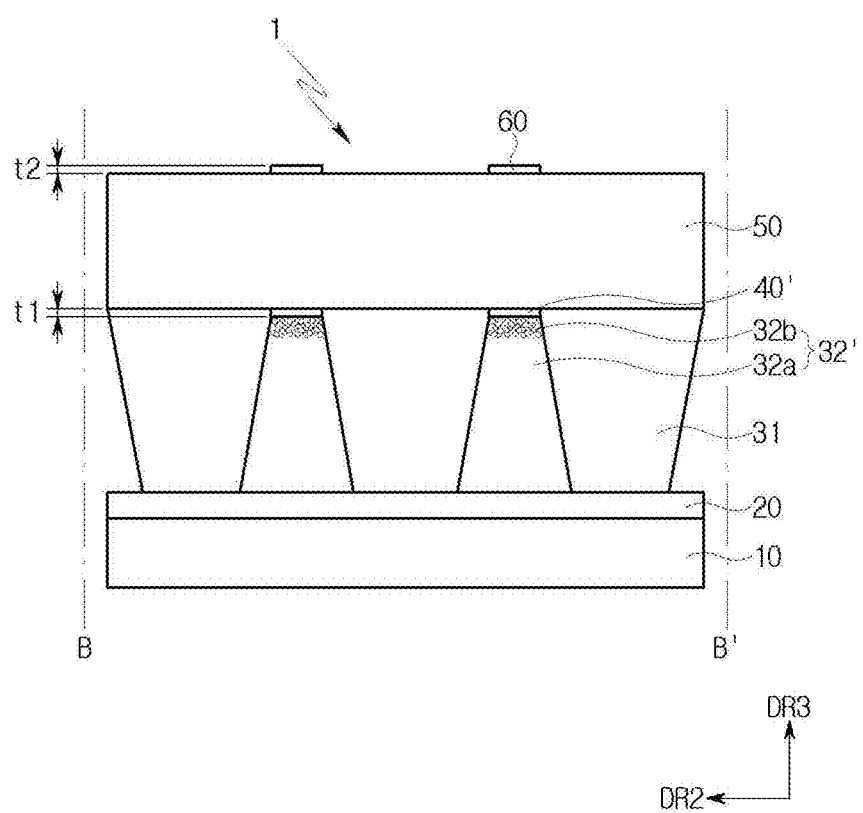
FIG. 4 is a cross-sectional view taken along the line B-B' in FIG. 1.
Figure 5:
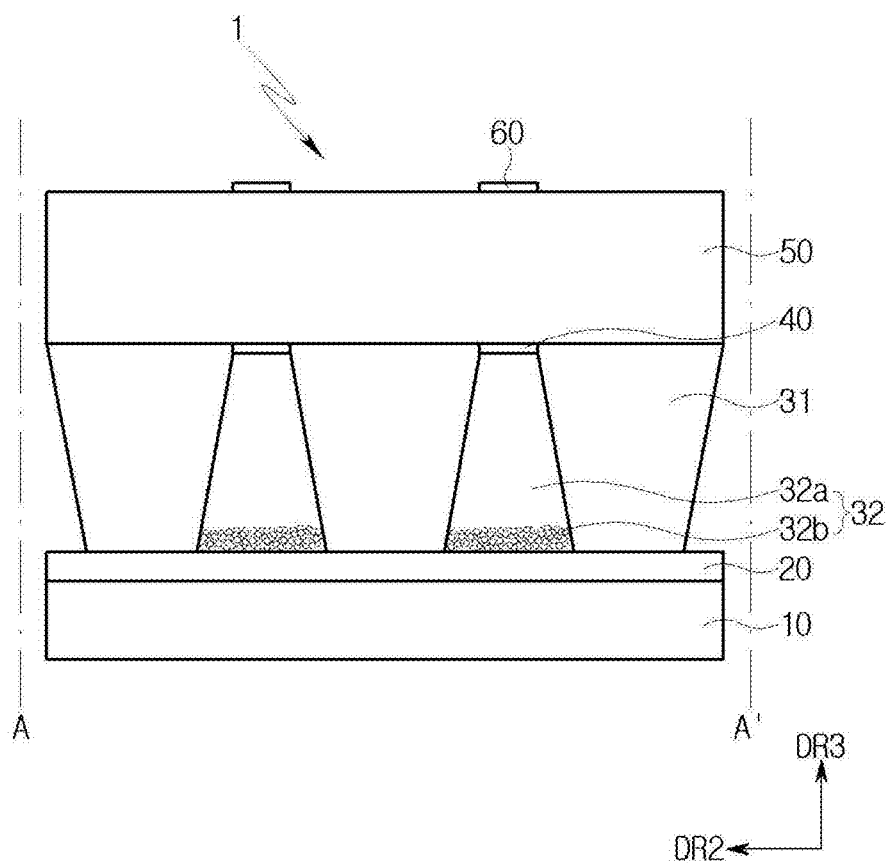
FIG. 5 is a cross-sectional view illustrating second and a third modes of the light path control member in FIG. 1.

FIG. 1 is a plan view of a second electrode and a third electrode according to an embodiment. FIG. 2 is a perspective view of a light path control member according to an embodiment. FIG. 3 is a cross-sectional view taken along the line A-A' in FIG. 1. FIG. 4 is a cross-sectional view taken along the line B-B' in FIG. 1. FIG. 5 is a cross-sectional view illustrating second and a third modes of the light path control member in FIG. 1.

Referring to FIGS. 1 to 5, a light path control member 1 according to an embodiment may include a first substrate 10, a first electrode 20 on the first substrate 10, light conversion units 31, 32, and 32' on the first electrode 20, second electrodes 40 and 40' on the light conversion units 31, 32, and 32', a second substrate 50 on the second electrodes 40 and 40', and third electrodes 60 and 60' on the second substrate 50. The light conversion units 31, 32, and 32' may be disposed between the first electrode 20 and the second electrodes 40 and 40'. The various light conversion units can also be referred to as light conversion members, structures, pillars, or the light. These are physical structures that modify the path of light.

The first substrate 10 may support the first electrode 20. The first substrate 10 may be rigid or flexible.

Also, the first substrate 10 may be transparent. For example, the first substrate 10 may include a transparent substrate capable of transmitting light.

The first substrate 10 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto.

Also, the first substrate 10 may be a flexible substrate having flexible characteristics.

Also, the first substrate 10 may be a curved or bent substrate. That is, the light path control member including the first substrate 10 may also be formed to have flexible, curved or bended characteristics. For this reason, the light path control member according to an embodiment may be changed into various designs.

The first substrate 10 may have a thickness of about 1 mm or less.

The first electrode 20 may be disposed on one surface of the first substrate 10. More specifically, the first electrode 20 may be disposed on the upper surface of the first substrate 10. That is, the first electrode 20 may be disposed between the first substrate 10 and the second substrate 50.

The first electrode 20 may include a transparent conductive material. For example, the first electrode 20 may include a metal oxide such as indium tin oxide, indium zinc oxide, copper oxide, tin oxide, zinc oxide, titanium oxide.

The light transmittance of the first electrode 20 may be about 80% or more. More specifically, the first electrode 20 may be disposed on the whole surface of one surface of the first substrate 10. That is, the first electrode 20 may be disposed as a surface electrode on the first substrate 10.

The first electrode 20 may have a thickness of about 10 nm to about 50 nm.

Alternatively, the first electrode 20 may include various metals to implement low resistance, but might have some parts that are opaque. For example, the first electrode 20 may include at least one metal selected from chromium (Cr), nickel (Ni), copper (Cu), aluminum (Al), silver (Ag), molybdenum (Mo), gold (Au), titanium (Ti), and alloys thereof. Since it desired for the first electrode to permit at least 80% of the light to pass therethrough, if an opaque metal is used, it can be in the form of a mesh with many openings or having structure that has 50% to 80% of the area as an aperture for light to pass through and 20% to 50% the opaque metal, such CU, AL, Ag or the like.

The first electrode 20 may be disposed on the whole surface of one surface of the first substrate 10. More specifically, the first electrode 20 may be disposed as a surface electrode on one surface of the first substrate 10 and can be a transparent electrode material in this example. However, an embodiment is not limited thereto, and the first electrode 20 may be formed of a plurality of patterned electrodes having a predetermined pattern, such as a mesh or various openings, in which examples, it may include an opaque metal.

The second substrate 50 may be disposed on the first substrate 10. The second substrate 50 may face the first substrate 10.

The second substrate 50 may include a material capable of transmitting light. The second substrate 50 may include a transparent material. The second substrate 50 may include the same or similar material as the first substrate 10 described above.

For example, the second substrate 50 may include glass, plastic, or a flexible polymer film. For example, the flexible polymer films may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto.

Also, the second substrate 50 may be a flexible substrate having flexible characteristics.

Also, the second substrate 50 may be a curved or bent substrate. That is, the light path control member including the second substrate 50 may also be formed to have a flexible, curved or bended characteristic. For this reason, the light path control member according to an embodiment may be changed into various designs.

The second substrate 50 may have a thickness of about 1 mm or less.

The second electrodes 40 and 40' may be disposed on one surface of the second substrate 50. More specifically, the second electrodes 40 and 40' may be disposed on the lower surface of the second substrate 50. That is, the second electrodes 40 and 40' may be disposed on a surface of the second substrate 50 facing the first substrate 10. Specifically, the second electrodes 40 and 40' may be disposed facing the first electrode 20 on the first substrate 10. Thus, the second electrodes 40 and 40' may be disposed between the first electrode 20 and the second substrate 50.

The second electrodes 40 and 40' may be disposed on the lower surface of the second substrate 50. The second electrodes 40 and 40' may be provided in plurality. The second electrodes 40 and 40' may include a sub-electrode 40 extending along a first direction DR1 and a second sub-electrode 40' extending along the second direction DR2. Each of the second electrodes 40 and 40' may be provided in plurality. The plurality of sub-electrodes 40 may be spaced apart in the second direction DR2, and the plurality of second sub-electrodes 40' may be spaced apart in the first direction DR1. The sub-electrode 40 and the second sub-electrode 40' may intersect at a cross area CP. A plurality of cross areas CP may be provided.

The second electrodes 40 and 40' may include a light absorbing material. A predetermined voltage may be applied to the second electrodes 40 and 40' in the first mode and the second mode, respectively, in order to form an electric field in the light path variable units 32 and 32' to be described later. The second electrodes 40 and 40' may include a conductive material in order to form an electric field by applying a predetermined voltage in the first mode and the second mode, respectively. The conductive material of the second electrodes 40 and 40' may include metal or conductive oxide. Examples of the metal include, but are not limited to, chromium (Cr), nickel (Ni), copper (Cu), aluminum (Al), silver (Ag), molybdenum (Mo), gold (Au), titanium (Ti), alloys thereof, or the like. Examples of the conductive oxide include, but are not limited to, transparent conductive materials such as indium-tin oxide (ITO), indium-zinc oxide (IZO), and indium-gallium-zinc oxide (IGZO).

As described above, the second electrodes 40 and 40' may function as a light-shielding unit like the third electrodes 60 and 60' by including a light absorbing material. That is, the second electrodes 40 and 40' may be an opaque metal, or the light absorbing material may be formed on a surface of the conductive material or conductive oxide. The second electrodes 40 and 40' may have a first thickness t1. The first thickness t1 may be about 30 um to about 50 um.

In some embodiments, the first thickness t1 of the second electrodes 40 and 40' may be smaller than the second thickness t2 of the third electrodes 60 and 60'.

The third electrodes 60 and 60' may be disposed on the other surface of the second substrate 50. More specifically, the third electrodes 60 and 60' may be disposed on the upper surface of the second substrate 50. That is, the third electrodes 60 and 60' may be disposed on a surface opposite to the surface of the second substrate 50 facing the first substrate 10. Thus, the third electrodes 60 and 60' may be spaced apart from the second electrodes 40 and 40' with the second substrate 50 therebetween.

The third electrodes 60 and 60' may be provided in plurality. The third electrodes 60 and 60' may include a third-first electrode 60 extending along the first direction DR1 and a fourth sub-electrode 60' extending along the second direction DR2. Each of the third electrodes 60 and 60' may be provided in plurality. The plurality of third sub-electrodes 60 may be spaced apart from each other in the second direction DR2, and the plurality of fourth sub-electrodes 60' may be spaced apart from each other in the first direction DR1. Each of the third electrodes 60 and 60' may overlap the corresponding second electrodes 40 and 40' and the light path variable units 32 and 32' in the thickness direction. The third sub-electrode 60 and the fourth sub-electrode 60' may intersect at the cross-area CP. A plurality of cross areas CP may be provided.

The third electrodes 60 and 60' extend along the first direction DR1, and the plurality of third electrodes 60 and 60' may be spaced apart from each other along the second direction DR2. The plurality of third electrodes 60 and 60' may overlap the second electrodes 40 and 40' under the third electrodes 60 and 60' in the thickness direction, respectively.

The third electrodes 60 and 60' may include a light absorbing material. The third electrodes 60 and 60' may serve to narrow a side viewing angle in a second mode to be described later. The third electrodes 60 and 60' are similar to the second electrodes 40 and 40' in that the second electrodes 40 and 40' include the light absorbing material and the second electrode 40 includes the light absorbing material, but unlike the second electrodes 40 and 40', the third electrodes 60 and 60' may not include a conductive material.

The third electrodes 60 and 60' may have a second thickness t2. The second thickness t2 may be about 30 um to about 50 um. The second thickness t2 may be the same as the first thickness t1.

Like some of the above-described embodiments, the first thickness t1 may be smaller than the second thickness t2. That is, in the case that the light path control member 1 widens the side viewing angle in the first mode, the light absorbing particles 32*b* of the light path variable units 32 and 32' are disposed adjacent to the second electrodes 40 and 40', the light absorbing particles 32*b* and the second electrodes 40 and 40' may absorb the side light and prevent the widening of the side viewing angle. To prevent this, the thickness t1 of the second electrodes 40 and 40' is formed to be smaller than the thickness t2 of the third electrodes 60 and 60', so that in the first mode, it is possible to prevent the light absorbing particles 32*b* and the second electrodes 40 and 40' from absorbing side light, thereby preventing the widening of the side viewing angle in advance.

The light conversion units 31, 32, and 32' may be disposed between the first substrate 10 and the second substrate 50. In more detail, the light conversion units 31, 32, and 32' may be disposed between the first electrode 20 and the second electrodes 40 and 40'.

The 1 light conversion units 31, 32, and 32' may include a light transmission part 31 and light path variable parts 32 and 32' around or otherwise adjacent to the light transmission part 31. The positions of the light absorbing particles 32*b* may be changed in the light path variable parts 32 and 32' according to the application of voltage. The light path variable parts 32 and 32' may be disposed between the adjacent light transmission parts 31. The light path variable parts 32 and 32' may overlap the second electrodes 40 and 40'. The light path variable parts 32 and 32' may be provided in plurality. Each of the plurality of light path variable parts 32 and 32' may extend along the first direction DR1 and be spaced apart from each other in the second direction DR2. Each of the plurality of light path variable parts 32 and 32' may overlap the second electrodes 40. The sum of the thickness of the light path variable parts 32 and 32' and the thickness t1 of the second electrodes 40 and 40' may be equal to the thickness of the light transmission part 31.

For example, the cross-sectional shape of the light path variable parts 32 and 32' may be a trapezoidal shape. That is, in the light path variable parts 32 and 32', the width of the upper surface may be smaller than the width of the lower surface.

The light transmission part 31 may include an opening. A cross-sectional shape of the opening may be the same as that of the light path variable parts 32 and 32'. The cross-sectional shape of the opening is not limited thereto, and may be an inverted trapezoidal shape, a rectangular shape, a square shape, or other polygonal shape.

The opening may be formed from a surface of the light transmission part 31.

Side surfaces of the light path variable parts 32 and 32' may directly contact the adjacent light transmission part 31. The upper surfaces of the light path variable parts 32 and 32' may contact the second electrodes 40 and 40' and the lower surfaces of the light path variable parts 32 and 32' may contact the first electrode 20. The lower surface of the light transmission part 31 may contact the first electrode 20 and the upper surface of the light transmission part 31 may contact the second substrate 50. The light transmission part 31 may contact the side surfaces of the second electrodes 40 and 40'.

There may be a plurality of light path variable portions 32 and 32'. The light path variable parts 32 and 32' may include a first light path variable part 32 extending along the first direction DR1 and a second light path variable part 32' extending along the second direction DR2. Each of the first light path variable part 32 and the second light path variable part 32' may be provided in plurality. The plurality of first light path variable parts 32 may be spaced apart from each other in the second direction DR2, and the plurality of second light path variable part 32' may be spaced apart from each other in the first direction DR1.

The light path variable parts 32 and 32' may include a dispersion solution 32*a* and the light absorbing particles 32*b*. More specifically, the light path variable parts 32 and 32' are added and filled with the dispersion solution 32*a*, and the plurality of light absorbing particles 32*b* may be dispersed in the dispersion solution 32*a*.

The dispersion solution 32*a* may be a material that disperses the light absorbing particles 32*b*. The dispersion solution 32*a* may include a transparent material. The dispersion solution 32*a* may include a non-polar solvent or other fluid. In addition, the dispersion solution 32*a* may include a material capable of transmitting light. For example, the dispersion solution 32*a* may include at least one of halocarbon-based oil, paraffin-based oil, and isopropyl alcohol.

The light absorbing particles 32*b* may be dispersed and disposed in the dispersion solution 32*a*. More specifically, the plurality of light absorbing particles 32*b* may be spaced apart from each other and disposed in the dispersion solution 32*a*.

The light absorbing particles 32*b* may include a material capable of absorbing light. The light absorbing particles may have a color. More specifically, the light absorbing particles 32*b* may include black particles capable of absorbing light. For example, the light absorbing particles may include carbon black particles.

The light transmission part 31 may transmit light provided from a lower part to an upper part. The light transmission part 31 may include a transparent material. The light transmission part 31 may include a material capable of transmitting light.

The light transmission part 31 may transmit light incident to one of the first substrate 10 and the second substrate 50 toward the other substrate.

Hereinafter, a mode with a wide side viewing angle illustrated in FIGS. 3 and 4 will be referred to as a first mode, such as a share mode, and a mode with a limited side viewing angle illustrated in FIG. 5 will be referred to as a second mode, such as a privacy mode. The third mode may have the same light path variable parts 32 and 32' as the second mode.

The switching from the first mode to the second mode may be implemented by moving the light absorbing particles 32*b* of the light path variable parts 32 and 32'. That is, the light absorbing particles 32*b* have charges on their surfaces and may move in the direction of the first electrode or the second electrode according to the characteristics of the charges in the application of voltage. That is, the light absorbing particles 32*b* may be electrophoretic particles.

As illustrated in FIGS. 3 and 4, in the first mode, the light absorbing particles 32*b* may be disposed adjacent to the second electrode 40, 40'. To this end, in the first mode, a (+) voltage may be applied to the second electrode 40, 40' and a (−) voltage may be applied to the first electrode 20. The surfaces of the light absorbing particles 32*b* are charged with (−) charge, and in the first mode, a repulsive force is formed with respect to the first electrode 20 and an attractive force is formed with respect to the second electrode 40, 40', so that the light absorbing particles 32*b* may be disposed adjacent to the second electrode 40, 40'.

As illustrated in FIG. 5, in the second mode, the light absorbing particles 32*b* may be disposed adjacent to the first electrode 20. To this end, in the second mode, a (−) voltage may be applied to the second electrode 40, 40' and a (+) voltage may be applied to the first electrode 20. The surfaces of the light absorbing particles 32*b* are charged with (−) charge, and in the second mode, an attractive force is formed with respect to the first electrode 20 and a repulsive force is formed with respect to the second electrode 40, 40', so that the light absorbing particles may be disposed adjacent to the first electrode 20.

In the specification, the meaning that the light absorbing particles 32*b* are disposed adjacent to the electrodes 20 and 40 in each mode is that based on the thickness of the light path variable part 32, 32', about 80% or more of the light absorbing particles 32*b* are placed in an area of 30% or less of the separation distance between the first electrode 20 and the second electrode 40, 40'. For example, in the first mode, about 80% or more of the light absorbing particles 32*b* are disposed in an area from the second electrode 40, 40' to a first distance in the thickness direction, and the first distance may be 30% or less of the thickness of the light path variable part 32, 32' (or separation distance between the first electrode 20 and the second electrode 40, 40'). In the second mode, about 80% or more of the light absorbing particles 32*b* are disposed in an area from the first electrode 20 to a second distance in the thickness direction, and the second distance may be 30% or less of the thickness of the light path variable part 32, 32' (or separation distance between the first electrode 20 and the second electrode 40, 40').

Meanwhile, the light path variable part 32, 32' according to an embodiment may maintain the second mode in the third mode, that is, a mode in which no voltage is applied to the respective electrodes 20 and 40. That is, in the third mode, the light absorbing particles 32*b* may be disposed adjacent to the first electrode 20. In order to maintain the second mode in the third mode, the light path variable part 32, 32' may further include an additive forming an electrical attraction with the (−) charged light absorbing particles 32*b*.

Hereinafter, the light path control function of the light path control member in each mode will be described.

Figure 6:
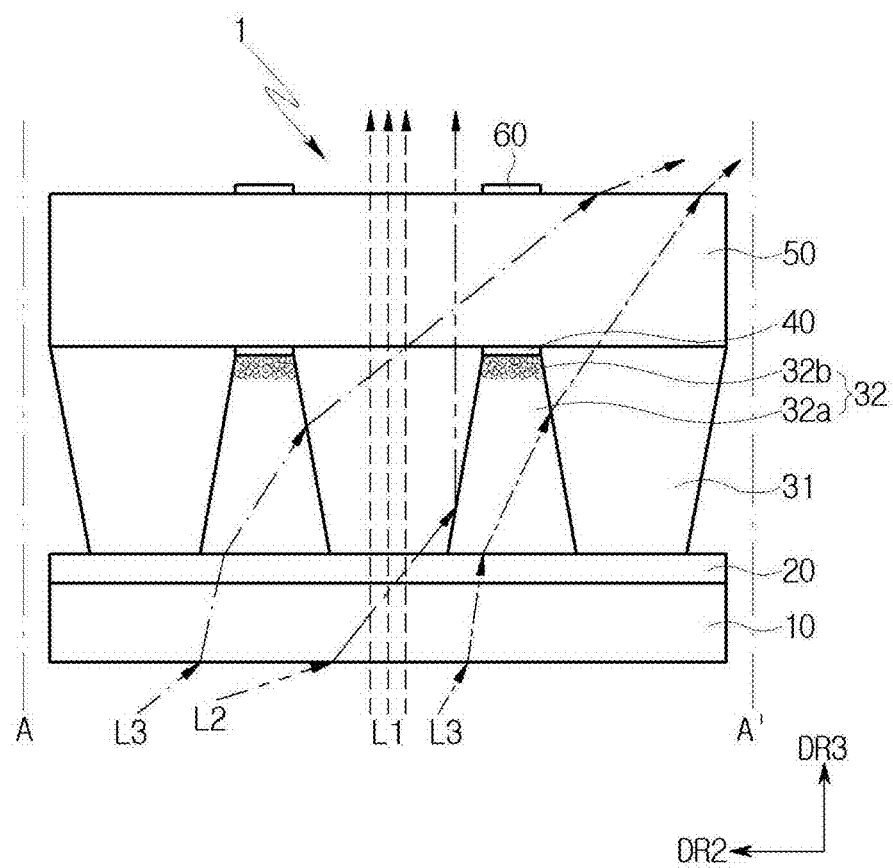
FIG. 6 is a schematic view illustrating a light path in a first mode.
Figure 7:
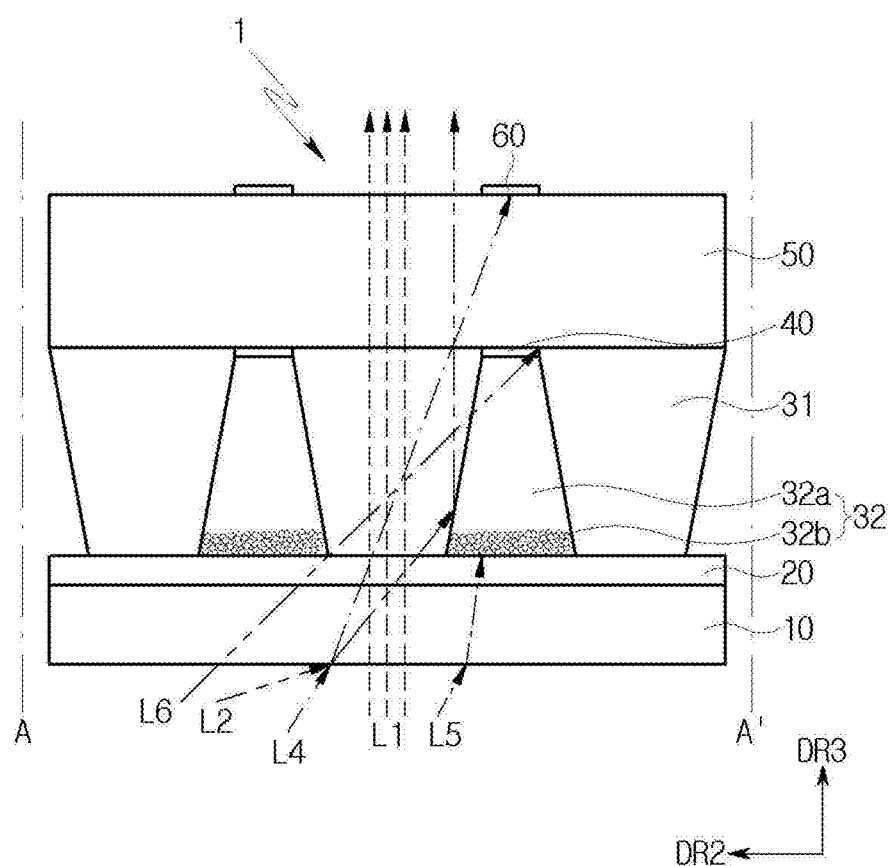
FIG. 7 is a schematic view illustrating light paths in a second mode and a third mode.
Figure 8:
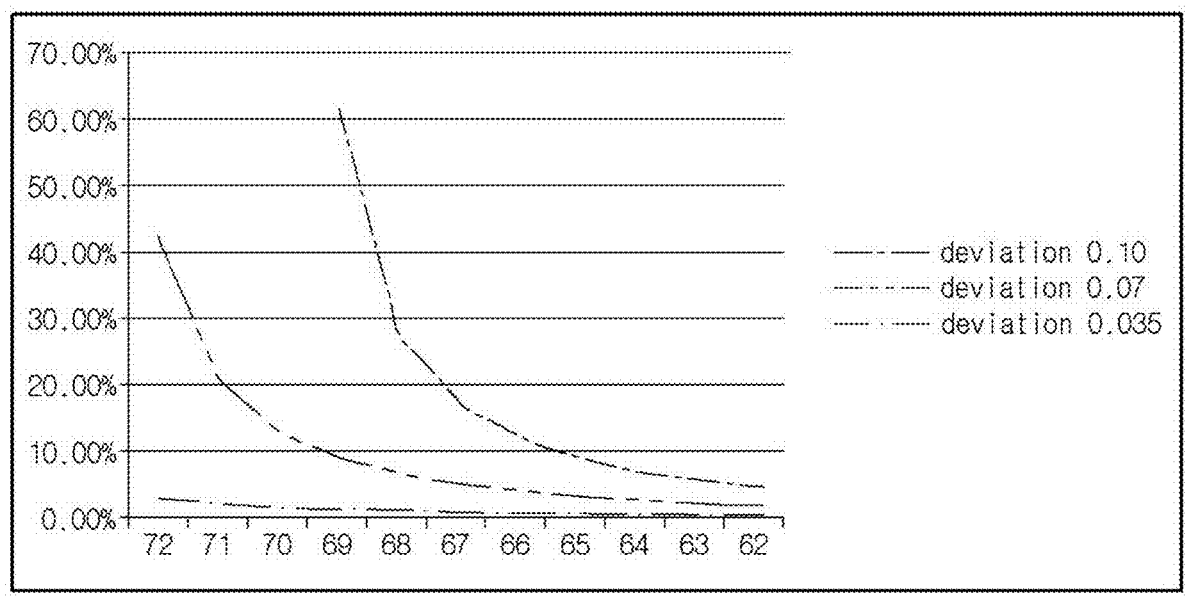
FIG. 8 is a graph illustrating an incidence angle of light (S-polarized light) incident from a light transmission part to a light path variable part and a reflectance of the light due to a difference in refractive index between the light transmission part and the light path variable part.
Figure 9:
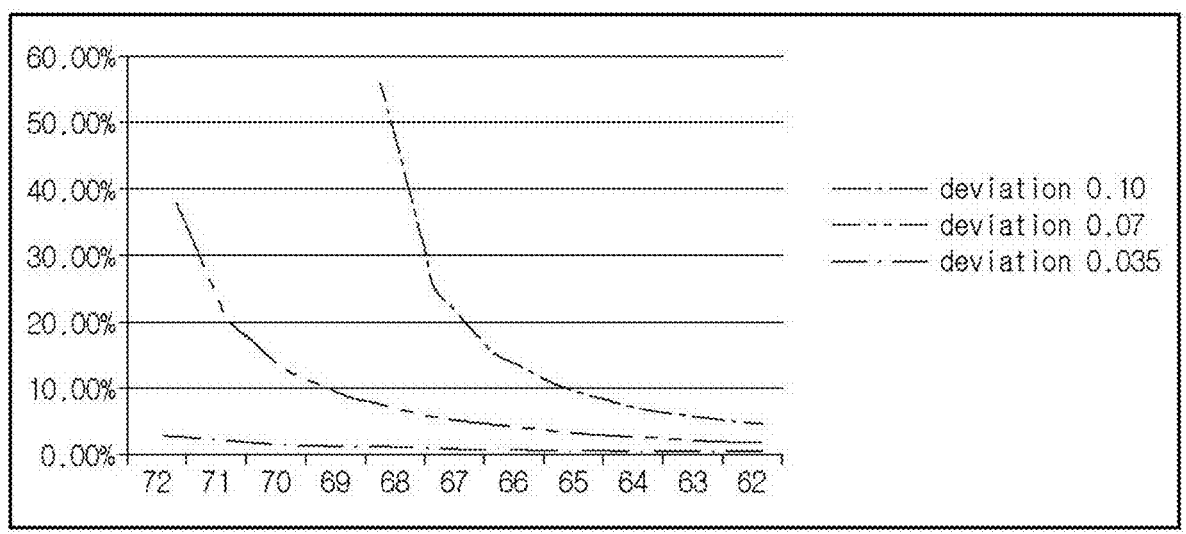
FIG. 9 is a graph illustrating an incidence angle of light (P-polarized light) incident from a light transmission part to a light path variable part and a reflectance of the light due to a difference in refractive index between the light transmission part and the light path variable part.

FIG. 6 is a schematic view illustrating a light path in a first mode. FIG. 7 is a schematic view illustrating light paths in a second mode and a third mode. FIG. 8 is a graph illustrating an incidence angle of light (S-polarized light) incident from a light transmission part to a light path variable part and a reflectance of the light due to a difference in refractive index between the light transmission part and the light path variable part. FIG. 9 is a graph illustrating an incidence angle of light (P-polarized light) incident from a light transmission part to a light path variable part and a reflectance of the light due to a difference in refractive index between the light transmission part and the light path variable part. FIGS. 10(*a*) and 10(*b*) are views illustrating front transmittance in a second mode and a first mode, respectively.

As illustrated in FIG. 6, in the first mode, the light L1 incident on the light transmission part 31 through the first substrate 10 and the first electrode 20 is emitted to the upper part of the second substrate 50 as it is. The light L2 incident from the light transmission part 31 to the side surface of the light path variable parts 32 and 32' is totally reflected at the interface between the light path variable parts 32 and 32' and the light transmission part 31, and is emitted to the upper part of the second substrate 50. The light L3 incident from the side surface of the light path variable parts 32 and 32' to the light transmission part 31 is refracted to the side surface at the interface between the light path variable parts 32 and 32' and the light transmission part 31 and may proceed in a lateral direction.

In order that the light L2 incident from the light transmission part 31 to the side surface of the light path variable parts 32 and 32' is totally reflected at the interface between the light path variable parts 32 and 32' and the light transmission part 31, and the light L3 incident from the side surface of the light path variable parts 32 and 32' to the light transmission part 31 is refracted to the side surface at the interface between the light path variable parts 32 and 32' and the light transmission part 31 to proceed in the lateral direction, the refractive indexes of the light path variable parts 32 and 32' and light transmission part 31 need to be adjusted. In particular, since the light absorbing particles 32*b* in the light path variable parts 32 and 32' are a material that absorbs light, it may be the dispersion solution 32*a* whose refractive index is to be adjusted.

In order that the light L2 incident from the light transmission part 31 to the side surface of the light path variable parts 32 and 32' is totally reflected at the interface between the light path variable parts 32 and 32' and the light transmission part 31, and the light L3 incident from the side surface of the light path variable parts 32 and 32' to the light transmission part 31 is refracted to the side surface at the interface between the light path variable part 32 and the light transmission part 31 to proceed in the lateral direction, the refractive index of the light transmission part 31 should be greater than the refractive index of the dispersion solution 32*a*. For example, the refractive index of the light transmission part 31 may be about 0.08 greater than the refractive index of the dispersion solution 32*a*. In some embodiments, the refractive index of the light transmission part 31 may be about 1.0 or more than the refractive index of the dispersion solution 32*a*.

FIG. 8 and Table 1 and FIG. 9 and Table 2 show the incident angle of the light (S-polarized light) incident from the light transmission part 31 to the light path variable parts 32 and 32' and the reflectance of the light due to the difference in the refractive indexes of the light transmission part 31 and light path variable parts 32 and 32'.

TABLE 1

| Θi | Δn 0.10 | Δn 0.07 | Δn 0.035 |
|---|---|---|---|
| 72 | Total reflection | 42.08% | 2.85% |
| 71 | Total reflection | 20.74% | 2.14% |
| 70 | Total reflection | 13.01% | 1.65% |
| 69 | 60.70% | 8.99% | 1.30% |
| 68 | 27.19% | 6.57% | 1.04% |
| 67 | 17.14% | 4.99% | 0.85% |
| 66 | 12.00% | 3.90% | 0.70% |
| 65 | 8.90% | 3.12% | 0.59% |

TABLE 2

| Θi | Δn 0.10 | Δn 0.07 | Δn 0.035 |
|---|---|---|---|
| 72 | Total reflection | 38.46% | 2.11% |
| 71 | Total reflection | 17.37% | 1.50% |
| 70 | Total reflection | 10.14% | 1.09% |
| 69 | 56.41% | 6.54% | 0.81% |
| 68 | 22.14% | 4.46% | 0.61% |
| 67 | 12.71% | 3.15% | 0.47% |
| 66 | 8.16% | 2.29% | 0.36% |
| 65 | 5.55% | 1.69% | 0.28% |

First, referring to FIG. 8 and Table 1, in the case that the deviation (or difference) between the refractive index of the light transmission part 31 and the refractive index of the dispersion solution 32*a* is 0.1 or more, it can be confirmed that total reflection occurs at the interface between the light transmission part 31 and the dispersion solution 32a, compared to the case of the deviation of 0.07 or 0.035.

Similarly, referring to FIG. 9 and Table 2, in the case that the deviation (or difference) between the refractive index of the light transmission part 31 and the refractive index of the dispersion solution 32a is 0.1 or more, it can be confirmed that total reflection occurs at the interface between the light transmission part 31 and the dispersion solution 32a, compared to the case of the deviation of 0.07 or 0.035.

According to an embodiment, in the case of the light path control member 1, the deviation (or difference) between the refractive index of the light transmission part 31 and the refractive index of the dispersion solution 32a is 0.1 or more, so that the light L2 incident from the light transmission part 31 to the side surface of the light path variable parts 32 and 32' is totally reflected at the interface between the light path variable parts 32 and 32' and the light transmission part 31, and the light L3 incident from the side surface of the light path variable parts 32 and 32' to the light transmission part 31 is refracted to the side surface at the interface between the light path variable parts 32 and 32' and the light transmission part 31 and proceeds in the lateral direction, whereby the front light emission efficiency can be maximized in the first mode.

As illustrated in FIG. 7, in the second mode (or third mode), the light L1 incident to the light transmission part 31 through the first substrate 10 and the first electrode 20 may be emitted to the upper part of the second substrate 50 as it is. The light L2 incident from the light transmission part 31 to the side surface of the light path variable parts 32 and 32' may be totally reflected at the interface between the light path variable parts 32 and 32' and the light transmission part 31. The light LA incident from the light transmission part 31 to the third electrodes 60 and 60' may be absorbed or reflected by the third electrodes 60 and 60', the light L5 incident on the lower part of the light path variable parts 32 and 32' may be absorbed by the light absorbing particles 32b disposed adjacent to the first electrode 20, and the light L6 incident on the second electrodes 40 and 40' may be absorbed by the second electrodes 40 and 40'.

Even in the second mode (or third mode), the deviation (or difference) between the refractive index of the light transmission part 31 and the refractive index of the dispersion solution 32a is 0.1 or more, so that the light L2 incident from the light transmission part 31 to the side surface of the light path variable parts 32 and 32' is totally reflected at the interface between the light path variable parts 32 and 32' and the light transmission part 31, thereby maximizing front light emission efficiency.

Figure 10A:
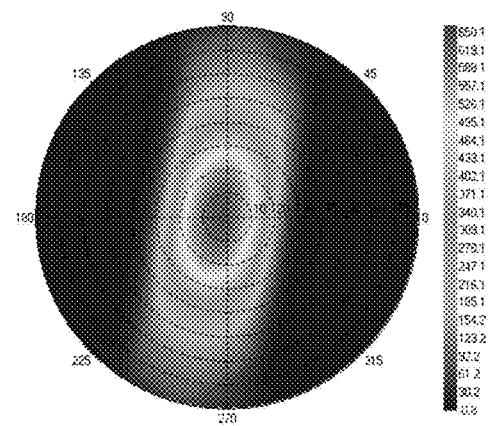
FIGS. 10(*a*) and 10(*b*) are views illustrating front transmittance in a second mode and a first mode, respectively.
Figure 10B:
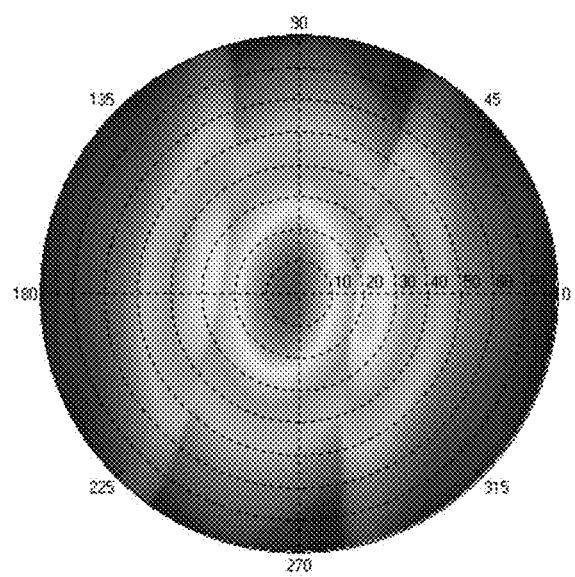

FIGS. 10(a) and 10(b) illustrate the front light emission efficiency in the second mode (or third mode) and the front light emission efficiency in the first mode, respectively.

Referring to FIGS. 10(a) and 10(b), the front light emission efficiency in the second mode (or third mode) and the front light emission efficiency in the first mode may be 70% or more, respectively. The reason why the front light emission efficiency in the second mode (or third mode) and the front light emission efficiency in the first mode are 70% or more is that, as described above, in the first mode or the second mode (or third mode), the deviation (or difference) between the refractive index of the light transmission part 31 and the refractive index of the dispersion solution 32a is 0.1 or more, so that the light incident from the light transmission part 31 to the side surface of the light path variable parts 32 and 32' is totally reflected at the interface between the light path variable parts 32 and 32' and the light transmission part 31, thereby maximizing front light emission efficiency.

Meanwhile, as described above, the second electrodes 40 and 40' may have a first thickness t1. The first thickness t1 may be about 30 um to about 50 um.

In some embodiments, the first thickness t1 of the second electrodes 40 and 40' may be smaller than the second thickness t2 of the second electrodes 60 and 60'.

Figure 11:
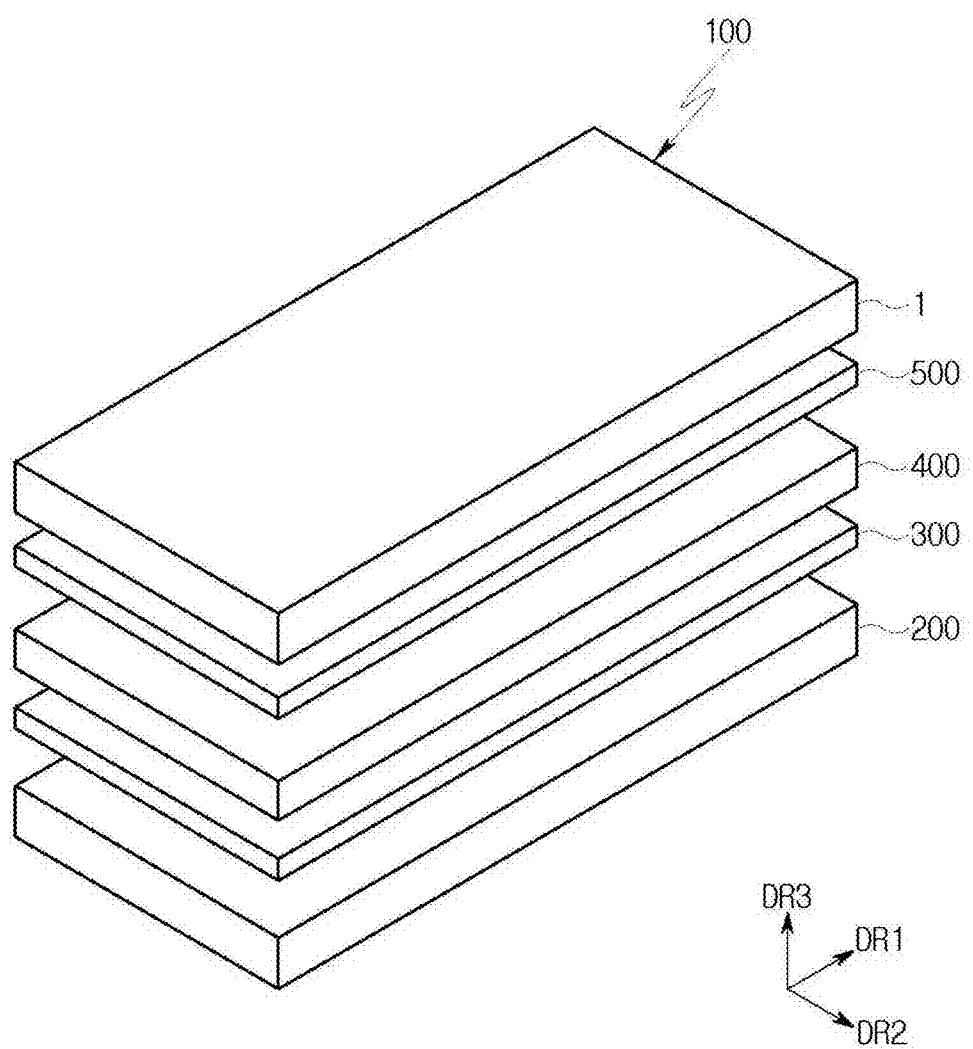
FIG. 11 is a perspective view of a display device according to an embodiment.
Figure 12:
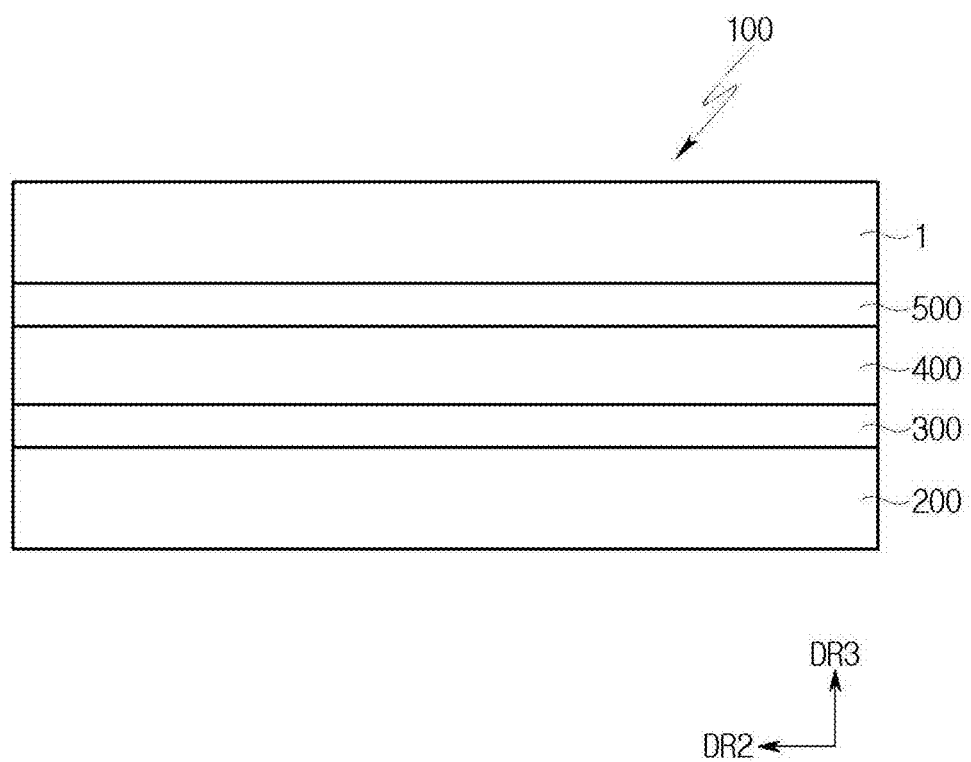
FIG. 12 is a cross-sectional view of FIG. 11.

FIG. 11 is a perspective view of a display device according to an embodiment. FIG. 12 is a cross-sectional view of FIG. 11.

Referring to FIGS. 11 and 12, a display device 100 according to an embodiment may include a display panel 200 disposed on a lower part of the light path control member 1, a first coupling member 300 between the display panel 200 and the light path control member 1, a polarization film 400 between the first coupling member 300 and the light path control member 1, and a second coupling member 500 between the polarization film 400 and the light path control member 1.

The display panel 200 and the polarization film 400 may be coupled through the first coupling member 300, and the polarization film 400 and the light path control member 1 may be coupled through the second coupling member 500.

The first coupling member 300 may include a light transparent adhesive (OCA), a light transparent resin (OCR), or the like, but is not limited thereto.

The second coupling member 500 may include a light transparent adhesive (OCA), a light transparent resin (OCR), or the like, but is not limited thereto.

The display panel 200 may include a plurality of pixels disposed in a display area of a base substrate and driving units disposed in a non-display area adjacent to or in some instances around the display area to drive the pixels. The pixels may include transistors (TFTs) connected to the driving units through a control signal line, and light emitting elements (OLEDs) connected to the transistors. The transistors are turned on or off according to a control signal applied through the control signal line to adjust the amount of current applied to the light emitting element. The light emitting element may emit light with a luminance corresponding to the amount of current applied through the transistor. The display panel 200 may further include a protective layer (Encap) encapsulating the light emitting elements (OLEDs) and an upper protective substrate (Pol). In some embodiments, the display panel 200 may be a liquid crystal display panel.

Hereinafter, other embodiments of the light path control member 1 will be described.

Figure 13:
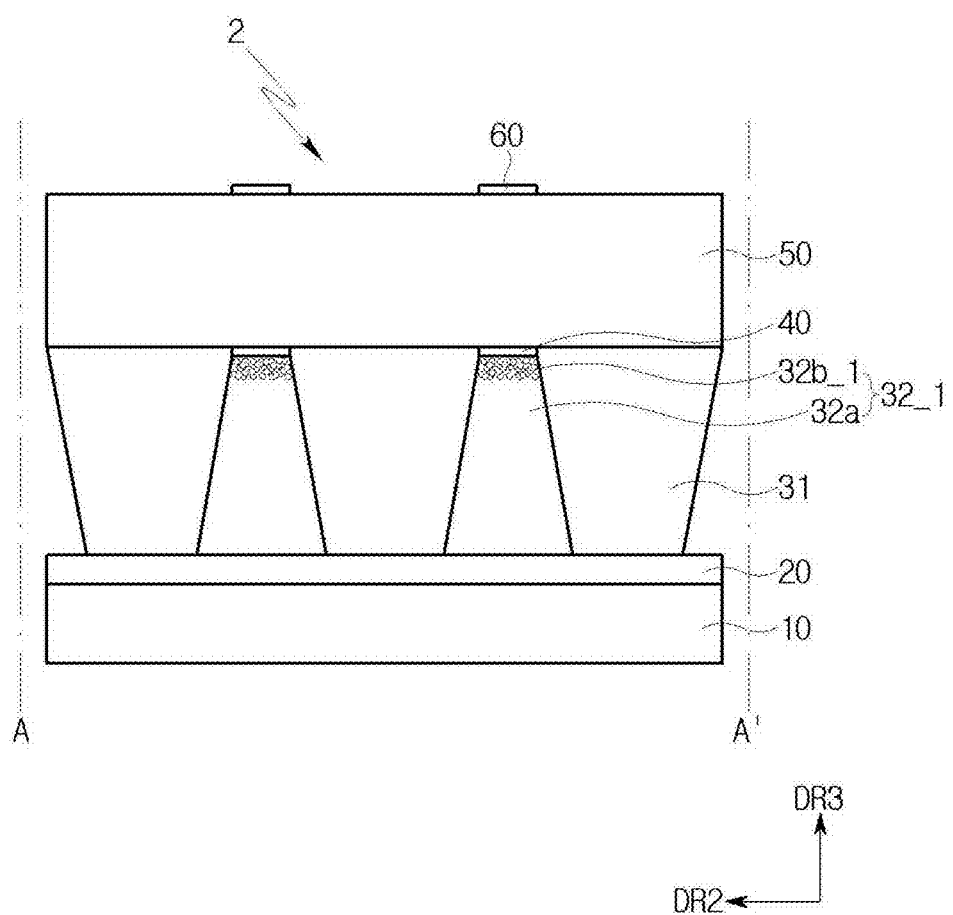
FIG. 13 is a cross-sectional view of a light path control member according to another embodiment in a first mode.
Figure 14:
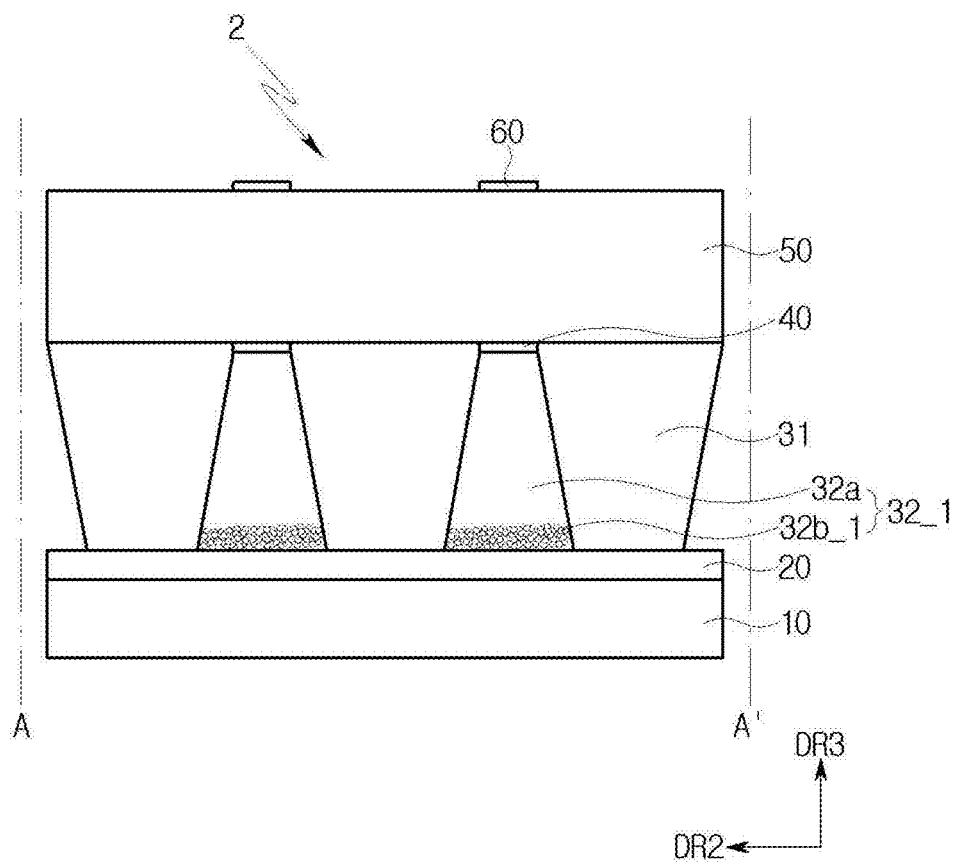
FIG. 14 is a cross-sectional view of the light path control member in FIG. 13 in a second mode.
Figure 15:
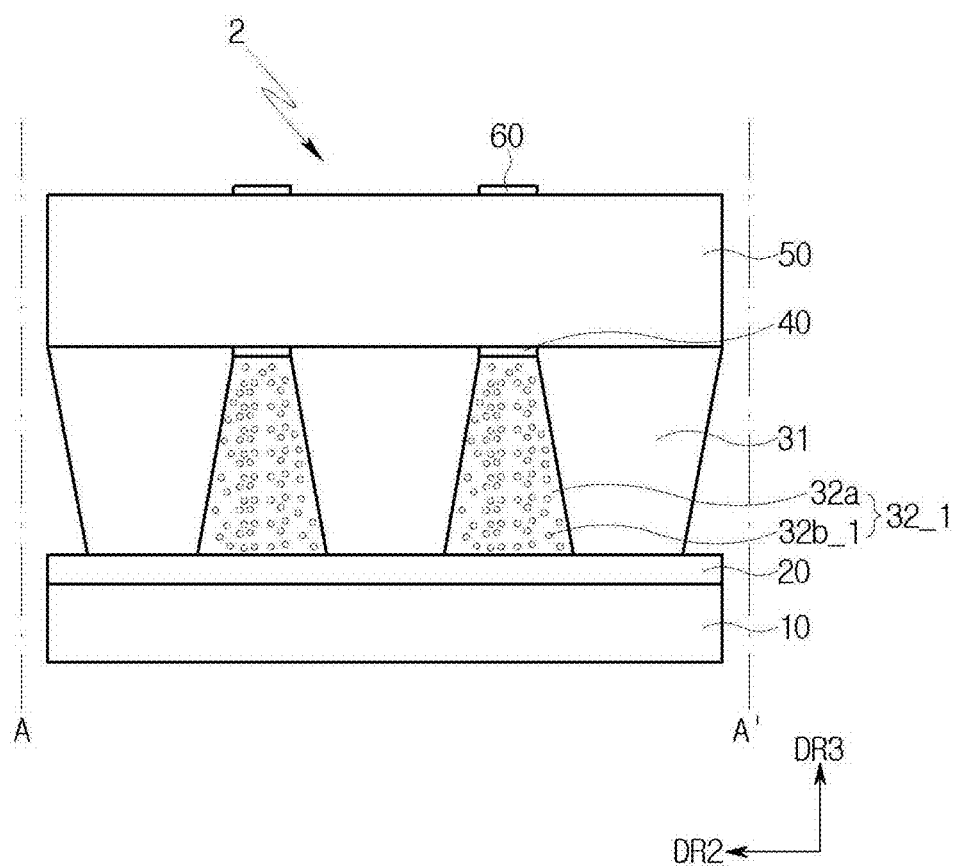
FIG. 15 is a cross-sectional view of the light path control member in FIG. 13 in a third mode.

FIG. 13 is a cross-sectional view of a light path control member according to another embodiment in a first mode. FIG. 14 is a cross-sectional view of the light path control member in FIG. 13 in a second mode. FIG. 15 is a cross-sectional view of the light path control member in FIG. 13 in a third mode.

Referring to FIGS. 13 to 15, a light path variable part 32_1 of a light conversion unit 30_1 of a light path control member 2 according to the present embodiment is different from the light path control member 1 in FIGS. 1 to 5 in that it does not include the additive included in the light path variable parts 32 and 32' in order to maintain the second mode in the third mode, as described above with reference to FIG. 5. In FIGS. 13 to 15, only the first light path variable part 32_1 is illustrated, but the second light path variable part may not include additives like the first path light path variable part 32_1.

More specifically, since the light path variable part 32_1 does not include the additive, the light absorbing particles 32b_1 may be dispersed and disposed in the dispersion solution 32a in the third mode in which no voltage is applied to the electrodes 20 and 40 as illustrated in FIG. 13. That is, in the light path control member 2 according to the present embodiment, the behaviors of the light absorbing particles 32b_1 in the second mode (see FIG. 14) and the third mode (see FIG. 15) may be different from each other. Even in the third mode, since the light absorbing particles 32b_1 are dispersed and disposed in the dispersion solution 32a, it can serve to limit the side viewing angle.

Other descriptions have been described above with reference to FIGS. 1 to 5, so detailed descriptions thereof will be omitted.

Figure 16:
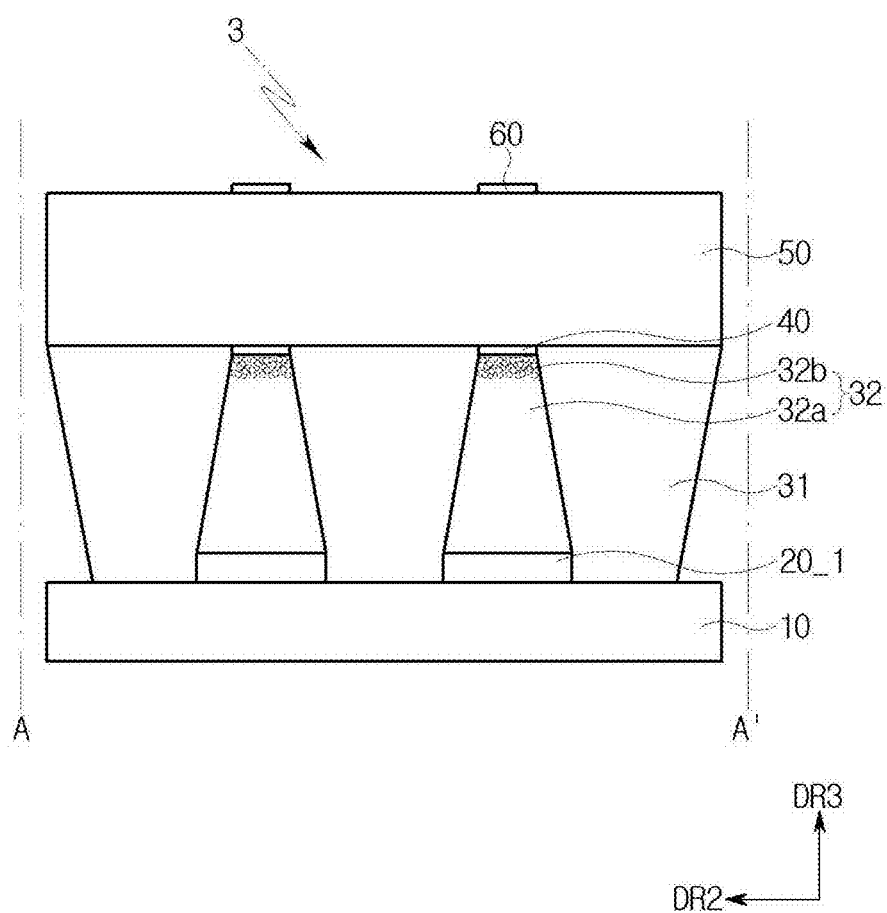
FIG. 16 is a cross-sectional view of a light path control member according to still another embodiment.

FIG. 16 is a cross-sectional view of a light path control member according to still another embodiment.

Referring to FIG. 16, a light path control member 3 according to the present embodiment is different from the light path control member 1 in FIG. 3 in that a first electrode 20_1 is not formed as a surface electrode but is provided in plurality.

More specifically, the first electrode 20_1 according to the present embodiment may be provided in plurality, and the plurality of first electrodes 20_1 may be spaced apart from each other and disposed in the second direction DR2. Each of the plurality of first electrodes 20_1 may overlap the second electrodes 40 and 40' in the thickness direction.

Other descriptions have been described above with reference to FIGS. 1 to 5, so detailed descriptions thereof will be omitted.

Figure 17:
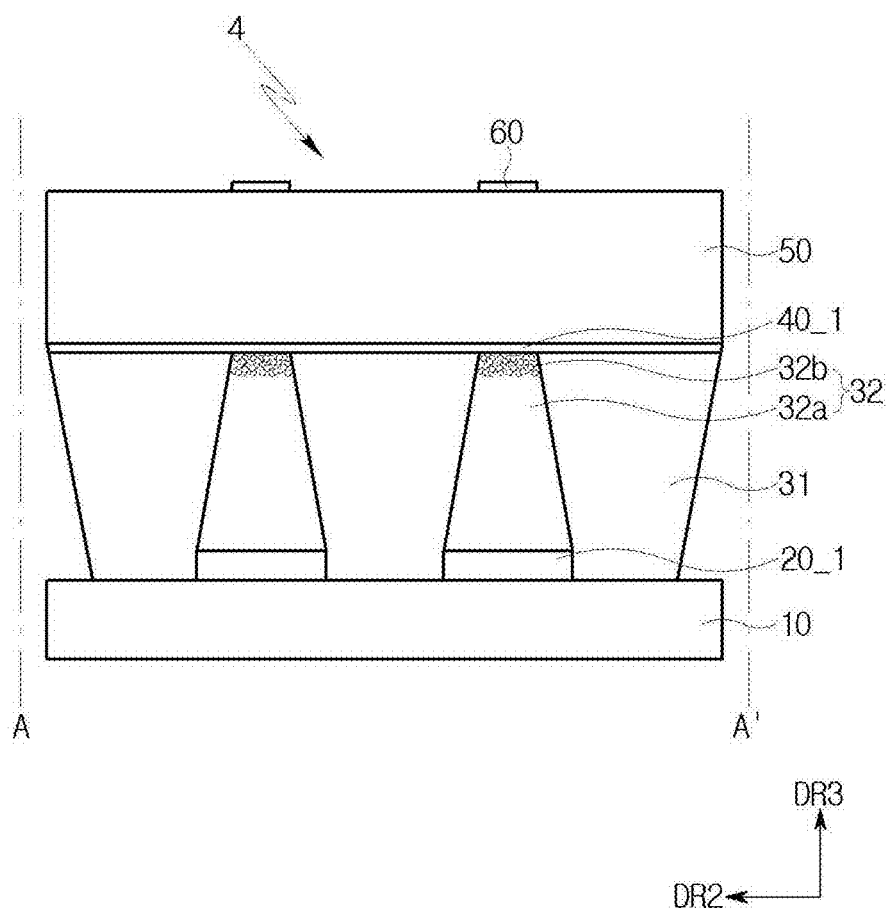
FIG. 17 is a cross-sectional view of a light path control member according to still another embodiment.

FIG. 17 is a cross-sectional view of a light path control member according to still another embodiment.

Referring to FIG. 17, a light path control member 4 according to this embodiment is different from the light path control member 3 in FIG. 13 in that a second electrode 40_1 is provided in the form of a surface electrode.

More specifically, the second electrode 40_1 according to the present embodiment may include a transparent conductive material. For example, the second electrode 40_1 may include a metal oxide such as indium tin oxide, indium zinc oxide, copper oxide, tin oxide, zinc oxide, and titanium oxide.

The second electrode 40_1 may be disposed on the second substrate 50 in a film shape. In addition, the light transmittance of the second electrode 40_1 may be about 80% or more. In more detail, the second electrode 40_1 may be disposed on the whole surface of one surface of the second substrate 50. That is, the second electrode 40_1 may be disposed as a surface electrode on the second substrate 50.

Other descriptions are described above with reference to FIG. 16, so detailed descriptions thereof will be omitted.

Figure 18:
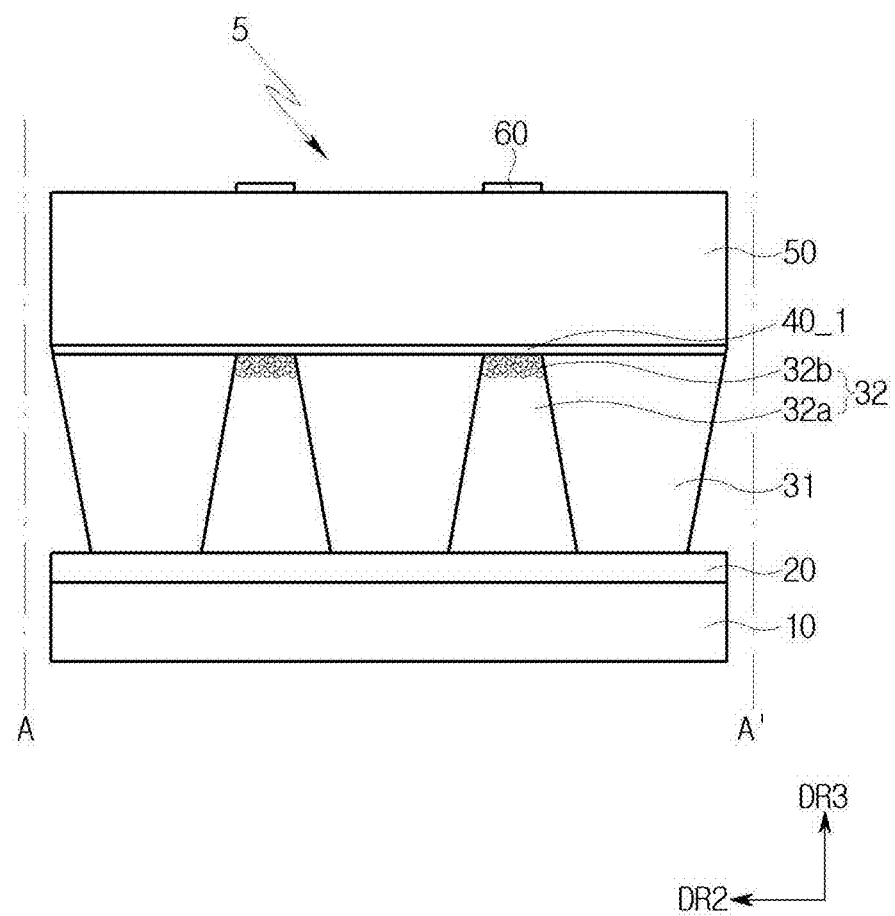
FIG. 18 is a cross-sectional view of a light path control member according to still another embodiment.

FIG. 18 is a cross-sectional view of a light path control member according to still another embodiment.

Referring to FIG. 18, a light path control member 5 according to the present embodiment is different from the light path control member 4 in FIG. 17 in that the first electrode 20 is disposed as a surface electrode as in FIG. 3.

Other descriptions are described above with reference to FIG. 17, so detailed descriptions thereof will be omitted.

Figure 19:
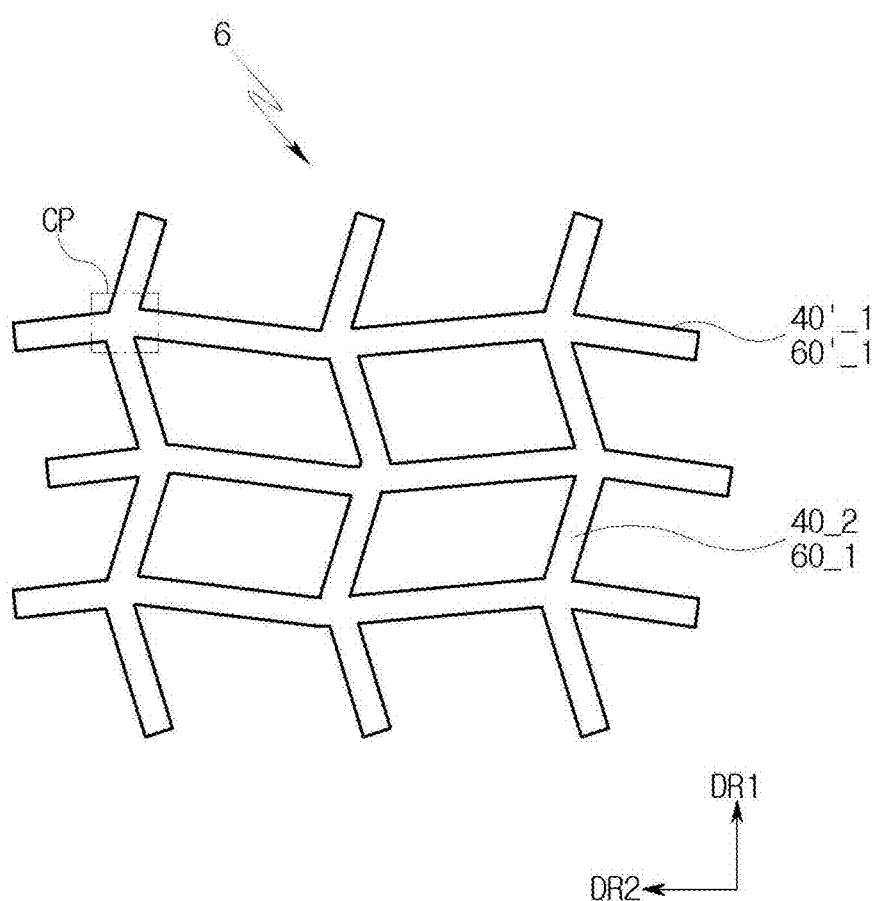
FIG. 19 is a plan view of a second electrode and a third electrode according to another embodiment.

FIG. 19 is a plan view of a second electrode and a third electrode according to another embodiment.

Referring to FIG. 19, second electrodes 40_2 and 40'_1 according to the present embodiment are different from the second electrodes 40 and 40' according to FIG. 1 in that the second electrodes 40_2 and 40'_1 extend in the first and second directions DR1 and DR2, respectively, and have a zigzag planar shape. Similarly, third electrodes 60_1 and 60'_1 according to the present embodiment is different from the third electrodes 60 and 60' according to FIG. 1 in that the third electrodes 60_1 and 60'_1 extend in the first and second directions DR1 and DR2, respectively, and have a zigzag planar shape.

The second electrodes 40_2 and 40'_1 and the third electrodes 60_1 and 60'_1 according to the present embodiment each have a zigzag planar shape, so that there is an advantage in that optical interference with the pixels of the display panel 200 is minimized and Moire defects can be reduced. For example, an angle between the sub-electrode 40_2 and the third sub-electrode 60_1 with the first direction DR1 may be about 7 degrees to about 15 degrees, respectively, and an angle between the second sub-electrode 40'_1 and the fourth sub-electrode 60'_1 with the second direction DR2 may be formed to be about 7 degrees to about 15 degrees, respectively.

Other descriptions are described above with reference to FIGS. 1 to 5, so detailed descriptions thereof will be omitted.

Figure 20:
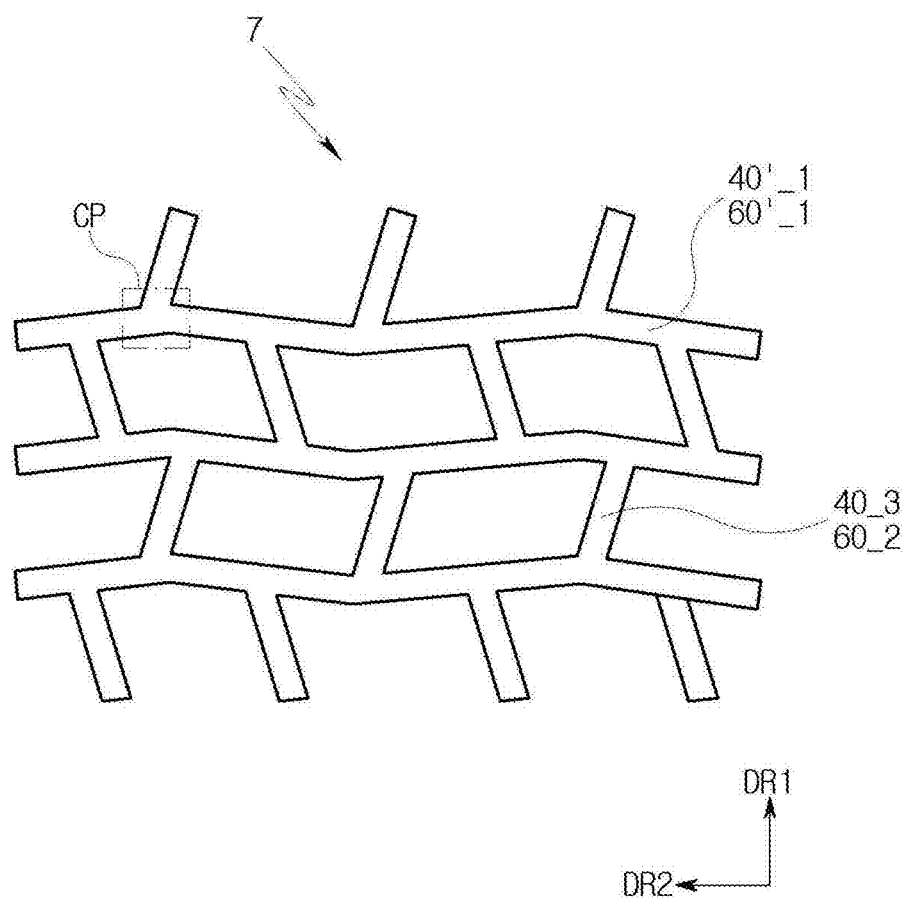
FIG. 20 is a plan view of a second electrode and a third electrode according to still another embodiment.

FIG. 20 is a plan view of a second electrode and a third electrode according to still another embodiment.

Referring to FIG. 20, the present embodiment is different from the embodiment of FIG. 19 in that the sub-electrode 40_3 and the third sub-electrode 60_2 generally extend along the first direction DR1, and may include a plurality of separated patterns.

More specifically, as illustrated in FIG. 20, the sub-electrode 40_3 may include a plurality of first patterns.

One first pattern (hereinafter referred to as a first-1 pattern) extends in a direction between one side in the first direction DR1 and the other side in the second direction DR2, and may be connected to one end in the first direction DR1 of the second sub-electrode 40_3 in one side in the first direction DR1. The first-1 pattern may be spaced apart from each other along the second direction DR2.

Another first pattern (hereinafter referred to as a first-2 pattern) extends in a direction between one side in the second direction DR2 and the other side in the first direction DR1, and may be connected to the other end in the first direction DR1 of the second sub-electrode 40_3 in one side in the first direction DR1. The first-2 patterns may be spaced apart from each other along the second direction DR2. On a plane, the first-1 pattern and the first-2 pattern may be alternately disposed along the second direction DR2.

The first-2 pattern may be connected to the second sub-electrode 40_3 on one side in the first direction DR1 and one end in one side in the first direction DR1 of the second sub-electrode 40_3 adjacent to the other side in the first direction DR1. The first-1 patterns may be connected to the second sub-electrode 40_3 in one side in the first direction DR1 and the other end of the second sub-40_3 in the other side in the first direction DR1 adjacent to the other side in the first direction DR1. The structures of the second sub-electrode 40_3 and the sub-electrode 40_3 described above may be repeatedly disposed along the first direction DR1.

Since the third sub-electrode 60_2 and the fourth sub-electrode 60'_1 have the same shape as the sub-electrode 40_3 and the second sub-electrode 40'_1, respectively, A detailed description will be omitted.

Other descriptions are described above with reference to FIGS. 1 to 5 and 19, so detailed descriptions thereof will be omitted.

Figure 21:
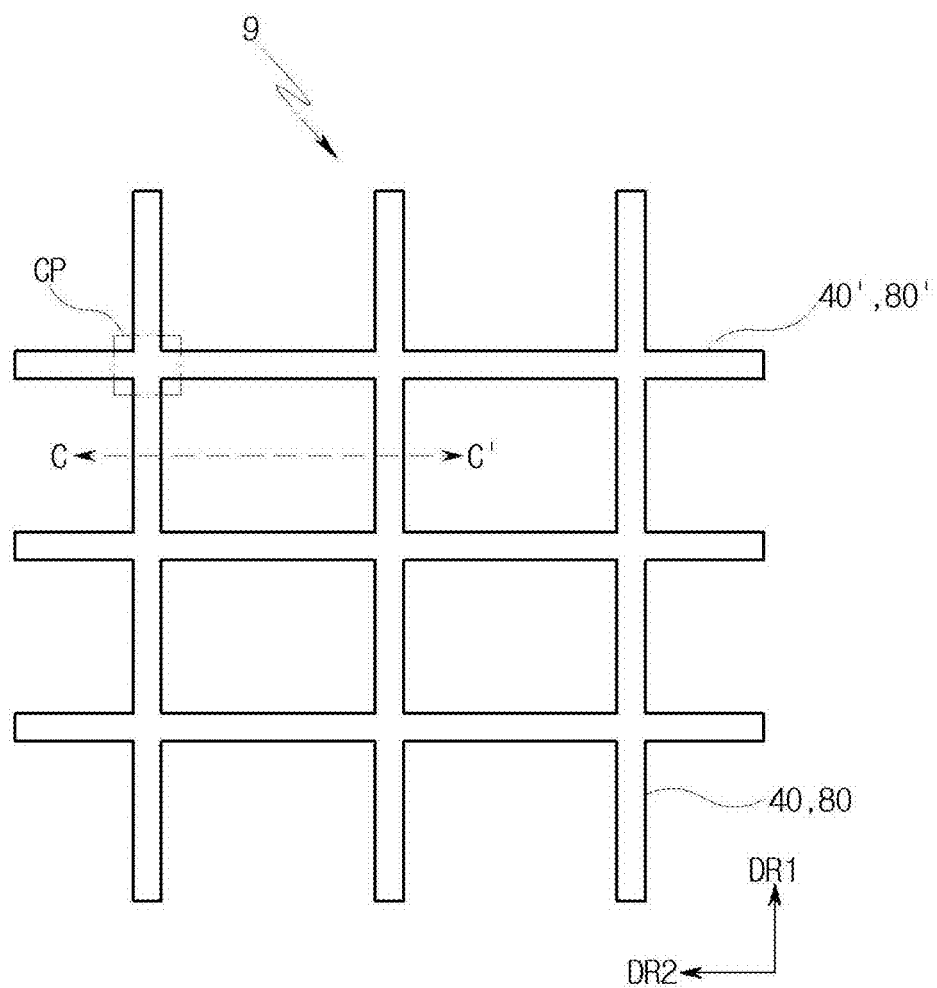
FIG. 21 is a plan view of a second electrode and a fourth electrode according to still another embodiment.
Figure 22:
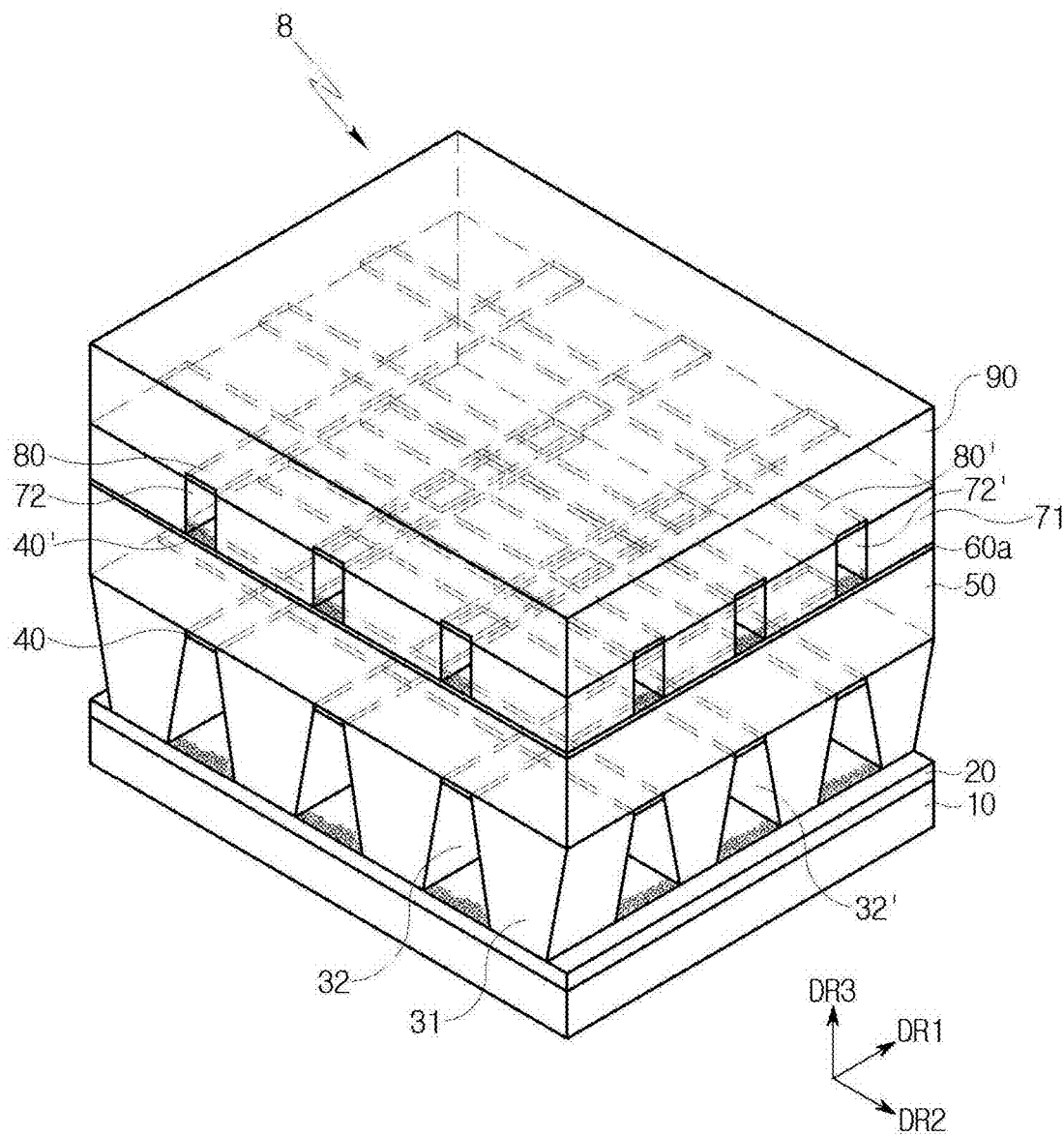
FIG. 22 is a perspective view of a light path control member according to still another embodiment.
Figure 23:
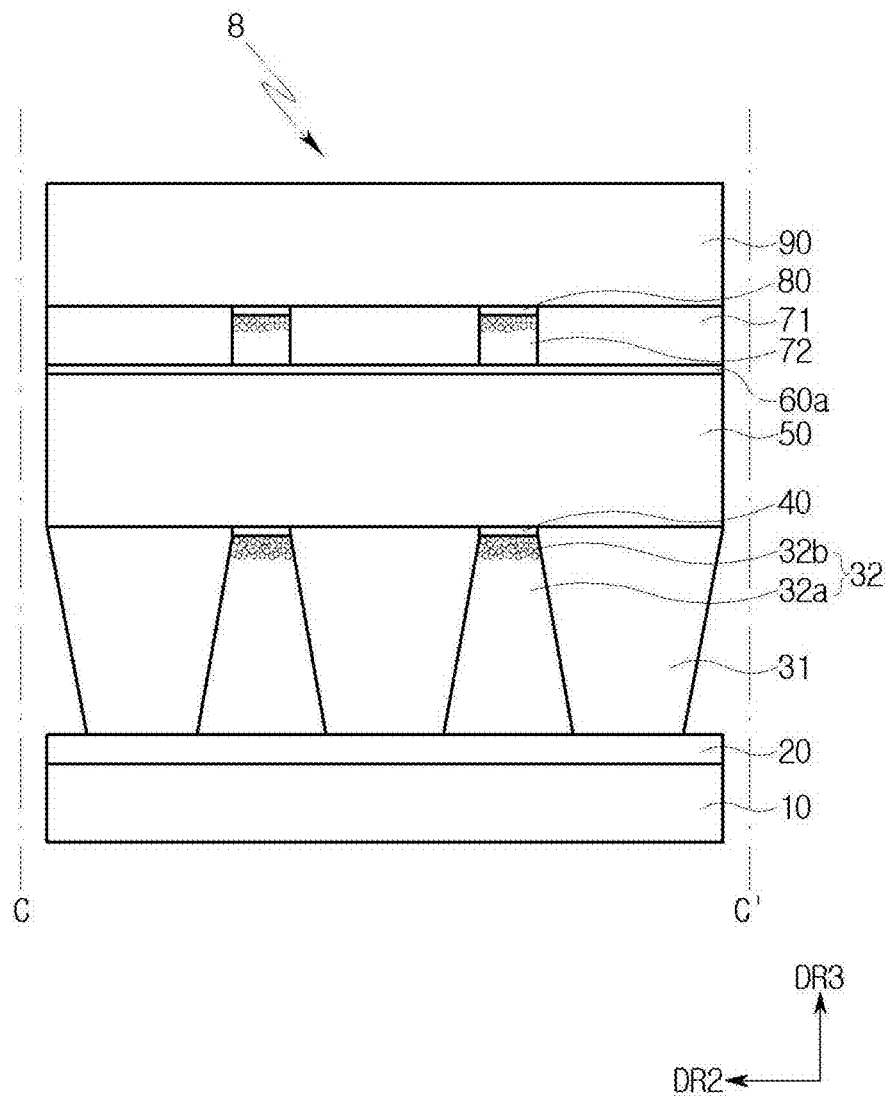
FIG. 23 is a cross-sectional view taken along the line C-C' in FIG. 21.
Figure 24:
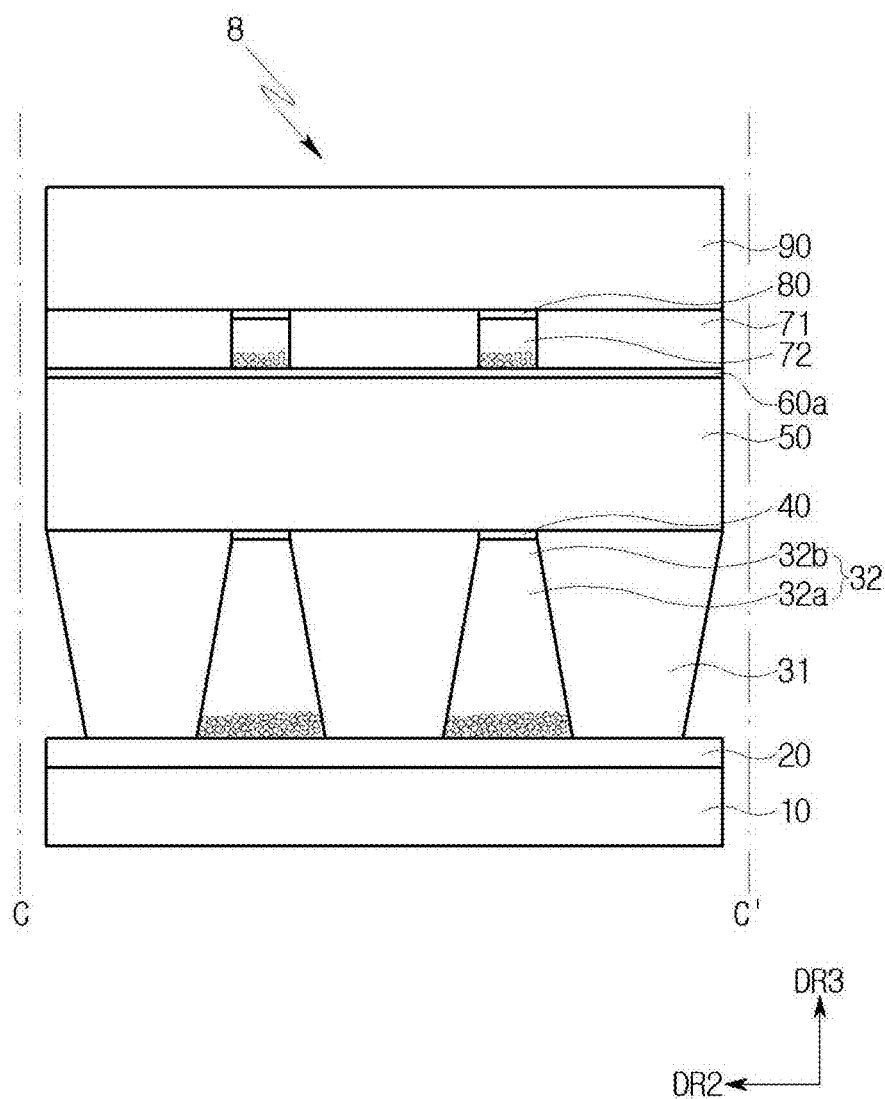
FIG. 24 is a cross-sectional view illustrating second and third modes of the light path control member in FIG. 23.

FIG. 21 is a plan view of a second electrode and a fourth electrode according to still another embodiment. FIG. 22 is a perspective view of a light path control member according to still another embodiment. FIG. 23 is a cross-sectional view taken along the line C-C' in FIG. 21. FIG. 24 is a cross-sectional view illustrating second and third modes of the light path control member in FIG. 23.

Referring to FIGS. 21 to 24, a light path control member 8 according to the present embodiment may include second light conversion units 71, 72, and 72' on the third electrode 60a, a fourth electrode 80 on the light conversion units 71, 72, and 72', and a third substrate 90 on the fourth electrode 80.

The third substrate 90 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto.

Unlike the third electrodes 60 and 60' in FIG. 2, the third electrode 60a may be a planar electrode. The third electrode 60a may include a transparent conductive material. For example, the third electrode 60a may include a metal oxide such as indium tin oxide, indium zinc oxide, copper oxide, tin oxide, zinc oxide, or titanium oxide.

The light transmittance of the third electrode 60a may be about 80% or more. In more detail, the third electrode 60a may be disposed on the whole surface of the upper surface of the second substrate 50.

The third electrode 60a may have a thickness of about 10 nm to about 50 nm.

The fourth electrodes 80 and 80' may be disposed on the lower surface of the third substrate 90. That is, the fourth electrodes 80 and 80' may be disposed on a surface of the third substrate 90 facing the second substrate 50.

The fourth electrodes 80 and 80' may be disposed on the lower surface of the third substrate 90. The fourth electrodes 80 and 80' may be provided in plurality. The fourth electrodes 80 and 80' may include a fourth-1 electrode 80 extending along the first direction DR1 and a fourth-2 electrode 80' extending along the second direction DR2. Each of the fourth electrodes 80 and 80' may be provided in plurality. The plurality of fourth-1 electrodes 80 may be spaced apart from each other in the second direction DR2, and the plurality of fourth-2 electrodes 80' may be spaced apart from each other in the first direction DR1. The fourth-1 electrode 80 and the fourth-2 electrode 80' may intersect at the cross area CP. A plurality of cross areas CP may be provided.

A predetermined voltage may be applied to the fourth electrodes 80 and 80' in the first mode and the second mode, respectively, in order to form an electric field in the second light path variable parts 72 and 72' to be described later. The fourth electrodes 80 and 80' may include a conductive material in order to form an electric field by applying a predetermined voltage in the first mode and the second mode, respectively. The conductive material of the fourth electrodes 80 and 80' may include a conductive oxide. Examples of the conductive oxide may include, but are not limited to, transparent conductive materials such as indium-tin oxide (ITO), indium-zinc oxide (IZO), and indium-gallium-zinc oxide.

The second light conversion units 71, 72, and 72' may be disposed between the third electrode 60a and the third substrate 90. More specifically, the second light conversion units 71, 72, and 72' may be disposed between the third electrode 60a and the fourth electrodes 80 and 80'.

The second light conversion units 71, 72, and 72' may include a light transmission part 71 and light path variable parts 72 and 72' adjacent to or around the light transmission part 71. The material and constitution of the light transmission part 71 may be the same as those of the light transmission part 31, and the material and constitution of the light path variable parts 72 and 72' may be the same as those of the light path variable part 32 and 32'. The light path variable parts 72 and 72' may be disposed between the adjacent light transmission parts 71. The light path variable parts 72 and 72' may overlap the fourth electrodes 80 and 80'. A plurality of light path variable parts 72 and 72' may be provided. Each of the plurality of light path variable parts 72 and 72' may extend along the first direction DR1 and be spaced apart from each other in the second direction DR2. Each of the plurality of light path variable parts 72 and 72' may overlap the fourth electrodes 80 and 80'. The sum of the thicknesses of the light path variable parts 72 and 72' and the thicknesses of the fourth electrodes 80 and 80' may be equal to the thickness of the light transmission part 71.

For example, the cross-sectional shape of the light path variable parts 72 and 72' may be a rectangular shape.

The light transmission part 71 may include an opening. A cross-sectional shape of the opening may be the same as those of the light path variable parts 72 and 72'. The cross-sectional shape of the opening is not limited thereto, and may be an inverted trapezoidal shape, a trapezoidal shape, a square, or other polygonal shape.

The opening may be formed from a surface of the light transmission part 71.

The side surfaces of the light path variable parts 72 and 72' may directly contact the adjacent light transmission part 71. The upper surfaces of the light path variable parts 72 and 72' may contact the fourth electrodes 80 and 80', and lower surfaces of the light path variable parts 72 and 72' may contact the third electrode 60a. The lower surface of the light transmission part 71 may contact the third electrode 60a and the upper surface of the light transmission part 71 may contact the third substrate 90. The light transmission part 71 may contact the side surfaces of the fourth electrodes 80 and 80'.

There may be a plurality of the light path variable parts 72 and 72'. The light path variable parts 72 and 72' may include a first light path variable part 72 extending along the first direction DR1 and a second light path variable part 72' extending along the second direction DR2. Each of the first light path variable part 72 and the second light path variable part 72' may be provided in plurality. The plurality of first light path variable parts 72 may be spaced apart from each other in the second direction DR2, and the plurality of second light path variable parts 72' may be spaced apart from each other in the first direction DR1.

In the switching from the first mode to the second mode, the light absorbing particles of the light path variable parts 72 and 72' may be moved. That is, the light absorbing particle has an electric charge on its surface, and may move toward the third electrode or the fourth electrode due to the characteristics of the electric charge, according to the application of a voltage.

As illustrated in FIG. 23, in the first mode, the light absorbing particles of the light path variable parts 72 and 72' may be disposed adjacent to the fourth electrodes 80 and 80'. To this end, in the first mode, a (+) voltage may be applied to the fourth electrodes 80 and 80', and a (−) voltage may be applied to the third electrode 60a. The surfaces of the light absorbing particles of the light path variable parts 72 and 72' are charged with negative (−) charges, so that in the first mode, a repulsive force is formed with respect to the third electrode 60*a* and an attractive force is formed with respect to the fourth electrodes 80 and 80', and thus, the light absorbing particles of the light path variable parts 72 and 72' may be disposed adjacent to the fourth electrodes 80 and 80'.

As illustrated in FIG. 24, in the second mode, the light absorbing particles of the light path variable parts 72 and 72' may be disposed adjacent to the third electrode 60*a*. To this end, in the second mode, a (−) voltage may be applied to the fourth electrodes 80 and 80', and a (+) voltage may be applied to the third electrode 60*a*. The surfaces of the light absorbing particles of the light path variable parts 72 and 72' are charged with negative (−) charges, so that in the second mode, an attractive force is formed with respect to the third electrode 60*a*, and a repulsive force is formed with respect to the fourth electrodes 80 and 80', so that the light path variable parts 72 and 72' may be disposed adjacent to the third electrode 60*a*.

Figure 25:
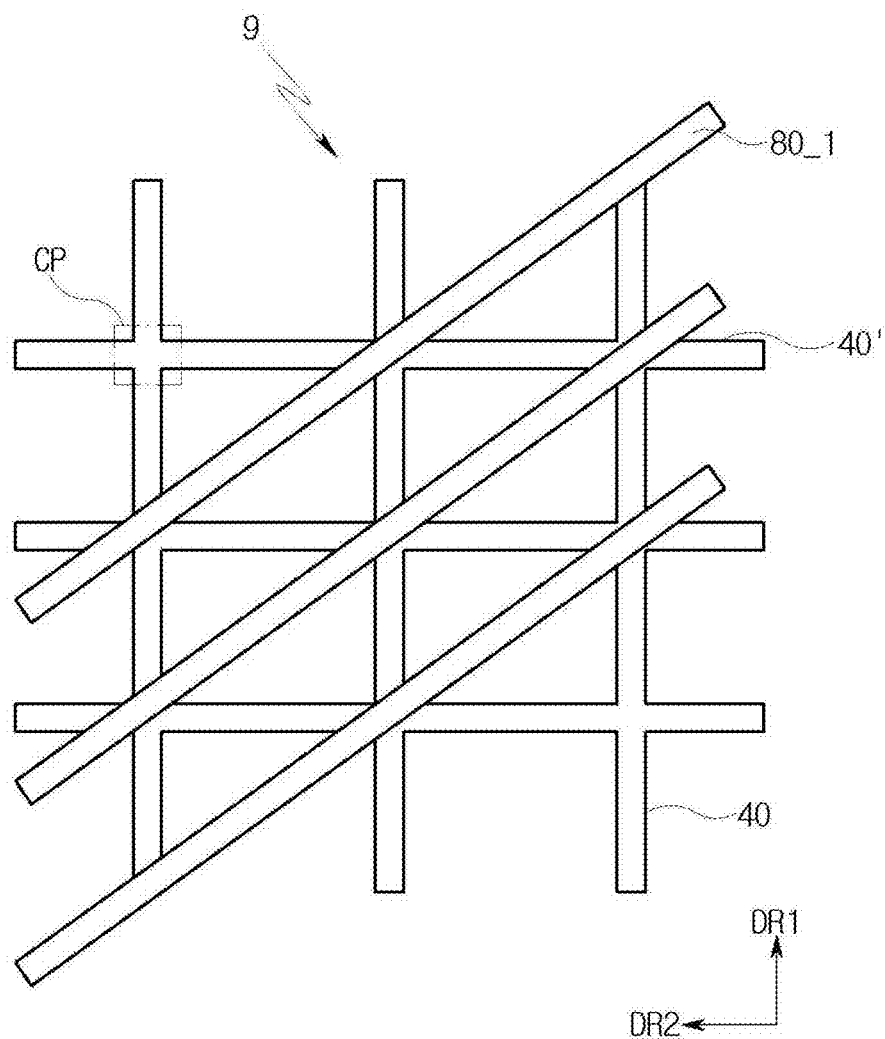
FIG. 25 is a plan view of a second electrode and a fourth electrode according to still another embodiment.

FIG. 25 is a plan view of a second electrode and a fourth electrode according to still another embodiment.

Referring to FIG. 25, a light path control member 9 according to the present embodiment is different from the light path control member 8 according to FIG. 21 in that the fourth electrode 80_1 extends in a direction between the first direction DR1 and the second direction DR2 (hereinafter, a first oblique direction). A plurality of fourth electrodes 80_1 may be provided, and each of the plurality of fourth electrodes 80_1 may be spaced apart from each other in a second oblique direction perpendicular to the first oblique direction.

As illustrated in FIG. 25, each of the plurality of fourth electrodes 80_1 may extend in the first oblique direction and overlap the cross areas CP. For this reason, in the first mode, when the light absorbing particles of the light path variable parts 72 and 72' are disposed adjacent to the fourth electrode 80_1, in particular, the light absorbing particles of the light path variable parts 72 and 72' are disposed adjacent to an area overlapping the cross area CP of the fourth electrode 80_1, and thus, there is an advantage that the light transmittance of the light path control member 9 is improved.

Other descriptions are described above with reference to FIGS. 22 to 24, so detailed descriptions thereof will be omitted.

Although the embodiments of the disclosure have been described above with reference to the accompanying drawings, it will be understood that the technical configuration of the present disclosure may be embodied in other specific forms by those skilled in the art to which the disclosure pertains without changing the technical spirit or essential features of the disclosure. Therefore, it should be understood that the embodiments described above are illustrative in all respects and not restrictive.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light path control member, comprising:
   a first substrate;
   a first electrode disposed on the first substrate;
   a first light conversion unit disposed on the first electrode;
   a second substrate disposed on the first light conversion unit;
   a second electrode including a first sub-electrode that is disposed between the second substrate and the first light conversion unit and extends along a first direction, and a second sub-electrode that extends along a second direction crossing the first direction; and
   a light absorbing member disposed on an upper surface of the second substrate, and
   wherein the first sub-electrode intersects the second sub-electrode,
   wherein the first light conversion unit includes a light transmission part and a light path variable part adjacent to the light transmission part,
   wherein the light path variable part includes a dispersion solution and light absorbing particles positioned in the dispersion solution, and
   wherein the light path variable part includes a first light path variable part extending in the first direction and a second light path variable part extending in the second direction, wherein the first light path variable part overlaps the first sub-electrode, and the second light path variable part overlaps the second sub-electrode, wherein the light absorbing member includes a third sub-electrode extending along the first direction and a fourth sub-electrode extending along the second direction, and the third sub-electrode overlaps the first light path variable part, and the fourth sub-electrode overlaps the second light path variable part.

2. The light path control member of claim 1, wherein the light path variable part changes a path of light according to voltage applied to the respective electrodes.

3. The light path control member of claim 1, wherein the first sub-electrode extends along the first direction, and the second sub-electrode extends along the second direction, each of the first sub-sub-electrode and the second sub-electrode extends in a zigzag shape.

4. The light path control member of claim 1, wherein the first sub-sub-electrode extends along the first direction in a zigzag shape, the second sub-electrode is provided in plurality, and each of the plurality of second sub-electrodes is connected to an end of the sub-electrode in the other side in the second direction and an end of the sub-electrode in one side in the second direction, and the second sub-electrode connected to the end of the sub-electrode in the other side in the second direction and the second sub-electrode connected to the end of the sub-electrode in the one side in the second direction are alternatively disposed along the first direction.

5. The light path control member of claim 1, wherein in a first mode, the light absorbing particles are disposed adjacent to the second electrode.

6. The light path control member of claim 5, wherein in the first mode, a (+) voltage is applied to the second electrode and a (−) voltage is applied to the first electrode.

7. The light path control member of claim 5, wherein in a second mode, the light absorbing particles are disposed adjacent to the first electrode.

8. The light path control member of claim 7, wherein in the second mode, a (−) voltage is applied to the second electrode and a (+) voltage is applied to the first electrode.

9. The light path control member of claim 7, wherein in a third mode, the light absorbing particles are disposed adjacent to the first electrode, and in the third mode, no voltage is applied to each of the first electrode and the second electrode.

10. The light path control member of claim 7, wherein in a third mode, the light absorbing particles are dispersed in the dispersion solution.

11. A light path control member, comprising:
a first substrate;
a first electrode disposed on the first substrate;
a first light conversion unit disposed on the first electrode;
a second substrate disposed on the first light conversion unit;
a second electrode including a first sub-electrode that is disposed between the second substrate and the first light conversion unit and extends along a first direction, and a second sub-electrode that extends along a second direction crossing the first direction; and
a light absorbing member disposed on an upper surface of the second substrate, and
wherein the first light conversion unit includes a light transmission part and a light path variable part adjacent to the light transmission part, and
wherein the light path variable part is provided in plurality, and the light transmission part is disposed between adjacent light path variable parts on a plane.

12. The light path control member of claim 1, wherein a thickness of the light absorbing member is 30 μm to 50 μm, wherein a thickness of the second electrode is smaller than a thickness of the light absorbing member, wherein the light absorbing member is a planar shape.

13. A light path control member, comprising:
a first substrate,
a first electrode disposed on the first substrate;
a first light conversion unit disposed on the first electrode;
a second substrate disposed on the first light conversion unit;
a second electrode including a first sub-electrode that is disposed between the second substrate and the first light conversion unit and extends along a first direction, and a second sub-electrode that extends along a second direction crossing the first direction; and
a light absorbing member disposed on an upper surface of the second substrate, and the light path control member further comprising:
a second light conversion unit on the light absorbing member;
a third substrate on the second light conversion unit; and
a fourth electrode between the second light conversion unit and the third substrate, wherein the fourth electrode includes a transparent conductive material.

14. A light path control member, comprising:
a first substrate;
a first electrode disposed on the first substrate;
a first light conversion unit disposed on the first electrode';
a second substrate disposed on the first conversion unit;
a second electrode including a first sub-electrode that id disposed between the second substrate and the first light conversion unit and extends along a first direction, and a second sub-electrode that extends along a second direction crossing the first direction; and
a light absorbing member disposed on an upper surface of the second substrate, and the light path control member, and wherein the fourth electrode extends in a direction between the first direction and the second direction, wherein the first sub-electrode and the second sub-electrode are plural to each other, a cross area where the first sub-electrode and the second sub-electrode intersect, and the fourth electrode passes through the cross area.

15. A display device, comprising:
a display panel; and
a light path control member on the display panel,
wherein the light path control member comprises:
a first substrate;
a first electrode disposed on the first substrate;
a first light conversion unit disposed on the first electrode;
a second substrate disposed on the first light conversion unit;
a second electrode including a first sub-electrode that is disposed between the second substrate and the first light conversion unit and extends along a first direction, and a second sub-electrode that extends along a second direction crossing the first direction; and
a light absorbing member disposed on an upper surface of the second substrate, and
wherein the first sub-electrode intersects the second sub-electrode,
wherein the first light conversion unit includes a light transmission part and a light path variable part adjacent to the light transmission part,
wherein the light path variable part includes a dispersion solution and light absorbing particles positioned in the dispersion solution, and
wherein the light path variable part includes a first light path variable part extending in the first direction and a second light path variable part extending in the second direction, wherein the first light path variable part overlaps the first sub-electrode, and the second light path variable part overlaps the second sub-electrode, wherein the light absorbing member includes a third sub-electrode extending along the first direction and a fourth sub-electrode extending along the second direction, and the third sub-electrode overlaps the first light path variable part, and the fourth sub-electrode overlaps the second light path variable part.

16. The display device of claim 15, further comprising a polarization film between the display panel and the light path control member.

17. The display device of claim 15, wherein the first light conversion unit includes a light transmission part and a light path variable part adjacent to the light transmission part, and the light path variable part changes a path of light provided according to voltage application.

18. A light path control apparatus comprising:
a first substrate;
a first electrode disposed on the first substrate;
a first light path modification structure disposed on the first electrode;
a second electrode disposed on the first light path modification structure, the second electrode being configured to modify the path of light passing through the first light path modification structure based on the value and polarity of a voltage present between the first and second electrodes;
a second substrate disposed on the second electrode; and
a light absorbing member disposed on an upper surface of the second substrate, and wherein the first sub-electrode intersections the second sub-electrode, wherein the first light conversion unit includes a light transmission part and a light path variable part adjacent to the light transmission part, wherein the light path variable part includes a dispersion solution and light absorbing particles positioned in the dispersion solution, and wherein the light path variable part includes a first light path variable part extending in the first direction and a second light path variable part extending in the second direction, wherein the first light path variable part overlaps the first sub-electrode, and the second light path variable part overlaps the second sub-electrode, wherein the light absorbing member includes a third sub-electrode extending along the first direction and a fourth sub-electrode extending along the second direction, and the third sub-electrode overlaps the first light path variable part, and the fourth sub-electrode overlaps the second light path variable part.

19. The light path control apparatus of claim 18 wherein the second electrode is in the form of a mesh having a first sub-electrode extending in first direction, and a second sub-electrode extending in a second direction that crosses the first direction and apertures between the first and second sub-electrode.

20. A light path control apparatus comprising:
a first substrate;
a first electrode disposed on the first substrate;
a first light path modification structure disposed on the first electrode;
a second electrode disposed on the first light path modification structure, the second electrode being configured to modify the path of light passing through the first light path modification structure based on the value and polarity of a voltage present between the first and second electrodes;
a second substrate disposed on the second electrode; and
a light absorbing member disposed on an upper surface of the second substrate, and wherein the second electrode is in the form of a mesh having a first sub-electrode extending in first direction, and a second sub-electrode extending in a second direction that crosses the first direction and apertures between the first and second sub-electrode, and wherein the light absorbing member is in the form of a mesh having a first sub-electrode extending in first direction, and a second sub-electrode extending in a second direction that crosses the first direction and apertures between the first and second sub-electrode.

21. The light path control apparatus of claim 20 wherein the sub-electrodes of the light absorbing member are parallel to the sub-electrodes of the second electrode.

22. The light path control apparatus of claim 20 wherein the sub-electrodes of the light absorbing member cross over sub-electrodes of the second electrode.

23. The light path control member of claim 1,
wherein the light absorbing member does not have a conductivity.

24. The light path control member of claim 1,
wherein a thickness of the second electrode is smaller than a thickness of the light absorbing member.

25. A display device of claim 15,
wherein the light absorbing member does not have a conductivity.

26. A display device of claim 15,
wherein a thickness of the second electrode is smaller than a thickness of the light absorbing member.

27. A light path control apparatus of claim 18,
wherein the light absorbing member does not have a conductivity.

28. A light path control apparatus of claim 18,
wherein a thickness of the second electrode is smaller than a thickness of the light absorbing member.

* * * * *